(12) United States Patent
Choi

(10) Patent No.: US 12,057,034 B2
(45) Date of Patent: Aug. 6, 2024

(54) DISPLAY DEVICE

(71) Applicant: Samsung Display Co., LTD., Yongin-si (KR)

(72) Inventor: Ha Young Choi, Gyeonggi-do (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 268 days.

(21) Appl. No.: 17/592,439

(22) Filed: Feb. 3, 2022

(65) Prior Publication Data

US 2023/0018953 A1 Jan. 19, 2023

(30) Foreign Application Priority Data

Jul. 9, 2021 (KR) .................. 10-2021-0090195

(51) Int. Cl.
*G09F 9/30* (2006.01)
*H10K 71/00* (2023.01)
*H10K 102/00* (2023.01)

(52) U.S. Cl.
CPC .............. *G09F 9/301* (2013.01); *H10K 71/00* (2023.02); *H10K 2102/311* (2023.02)

(58) Field of Classification Search
CPC ....................................................... G09F 9/301
See application file for complete search history.

(56) References Cited

U.S. PATENT DOCUMENTS

| 9,113,545 | B2* | 8/2015 | Han | H05K 7/00 |
| 10,141,540 | B2* | 11/2018 | Sung | H10K 71/00 |
| 10,873,043 | B2* | 12/2020 | Jin | H10K 50/86 |
| 11,143,891 | B2* | 10/2021 | Lee | H10K 59/50 |
| 11,598,983 | B2* | 3/2023 | Lee | H10K 59/50 |
| 2021/0349341 | A1* | 11/2021 | Lee | H10K 59/50 |
| 2021/0359072 | A1* | 11/2021 | Lee | H10K 59/131 |

FOREIGN PATENT DOCUMENTS

| KR | 1020170125639 A | 11/2017 |
| KR | 1020210026578 A | 3/2021 |

* cited by examiner

*Primary Examiner* — Lisa Lea-Edmonds
(74) *Attorney, Agent, or Firm* — CANTOR COLBURN LLP

(57) ABSTRACT

A display device includes a display panel including a main area including a plurality of pixels, a bending area, and a pad area, in order, and each of the main, bending and pad areas including an upper surface, and a lower surface which is opposite to the upper surface, a driving part on the upper surface of the pad area, an adhesive member on the lower surface of the main area, and a lower support body on the lower surface and including a flexible support part facing the lower surface of the main area with the first adhesive member therebetween, and a rigid support part which is directly on the lower surface of the pad area and is less flexible than the flexible support part

20 Claims, 36 Drawing Sheets

DP: DC, CB
1008: 1108, 1208
1108: 1108_1, 1108_2

DISPLAY DEVICE

This application claims priority to Korean Patent Application No. 10-2021-0090195 filed on Jul. 9, 2021, and all the benefits accruing therefrom under 35 U.S.C. 119, the contents of which in its entirety are herein incorporated by reference.

BACKGROUND

1. Field

The disclosure relates to a flexible display device and a method of manufacturing (or providing) the same.

2. Description of the Related Art

The importance of display devices has increased with the development of multimedia. Accordingly, various types of display devices such as an organic light emitting display (OLED) and a liquid crystal display (LCD) have been used.

With the development of display technology, research and development of display devices having flexible displays have been actively conducted. The flexible display may extend or contract a display screen, for example, by folding, bending, or sliding the display screen to significantly contribute to a decrease in volume or a design change of the display device.

SUMMARY

One or more embodiment provides a display device which reduces or effectively prevents a chemical defect caused by high-temperature and high-pressure conditions, when a component is mounted on a panel pad part.

However, features of the disclosure are not restricted to those set forth herein. The above and other features of the disclosure will become more apparent to one of ordinary skill in the art to which the disclosure pertains by referencing the detailed description of the disclosure given below.

According to an embodiment, a display device includes a display panel including a main area including a plurality of pixels, a bending area extending from one side of the main area, and a pad area extending from one side of the bending area, a driving part on the pad area of the display panel, and a lower support body on a lower surface of the display panel to support the display panel. The lower support body includes a flexible support part on a lower surface of the main area through a first adhesive member to support the main area, and a rigid support part directly on a lower surface of the pad area to support the pad area.

The flexible support part may include a polymer film, and the rigid support part may include glass.

The first adhesive member may be between the flexible support part and the main area, to attach the flexible support part to the display panel.

The rigid support part may be in direct contact with the lower surface of the display panel.

The rigid support part may be spaced apart from the flexible support part with the bending area therebetween.

A thickness of the rigid support part may be equal to or smaller than a sum of thicknesses of the flexible support part and the first adhesive member.

A thickness of the rigid support part may be about 200 micrometers (μm) or less.

The rigid support part may have a multi-stage configuration including a plurality of stage-layer parts.

The multi-stage configuration may have a width that decreases towards a bottom of the rigid support part.

The plurality of stage-layer parts may include a first stage-layer part at a portion where the pad area and the rigid support part are in contact with each other, and the rigid support part may have the smallest thickness in the first stage-layer part.

A surface roughness of a side surface of the rigid support part and a surface roughness of a lower surface of the rigid support part may be different from each other.

The surface roughness of the lower surface of the rigid support part may be smaller than the surface roughness of the side surface of the rigid support part.

One side surface of the rigid support part may be aligned with one end of the pad area of the display panel.

According to an embodiment, a display device includes a display panel including a main area including a plurality of pixels, a bending area extending from one side of the main area, and a pad area extending from one side of the bending area, a driving part on the pad area of the display panel, and a lower support body on a lower surface of the display panel to support the display panel. The lower support body includes a support film attached to a lower portion of the main area through a first adhesive member, and a support glass directly on a lower surface of the pad area. The support film and the support glass face each other, and are attached to each other through a second adhesive member therebetween.

A thickness of the support glass may be equal to or smaller than a thickness of the support film.

The support glass may have a multi-stage configuration including a plurality of stage-layer parts, and the multi-stage configuration may have a width that becomes smaller in a direction toward the support film.

According to an embodiment, a method of providing a display device includes providing a display panel on a glass substrate, the display panel including a flexible substrate on one surface thereof and including a first area and a second area, selectively removing an area of the glass substrate overlapping the first area, from the display panel, to expose a lower surface of the first area of the display panel and form a support glass in the second area, and attaching a support film to the lower surface of the first area of the display panel.

A method of manufacturing a display device may further include, after the attaching of the support film, mounting a driving part on the second area of the display panel.

A method of manufacturing a display device may further include, after the mounting of the driving part, bending the display panel so that the first area and the second area face each other and the support film and the support glass are bonded to each other.

A method of manufacturing a display device may further include, before the selective removing of the area of the glass substrate, reducing a thickness of the glass substrate so that the thickness of the glass substrate becomes equal to or smaller than a thickness of the support film.

The display device according to one or more embodiment of the disclosure may reduce or effectively prevent a chemical defect caused by high-temperature and high-pressure conditions, when a component such as a driving part, is mounted on a pad area.

The effects of the disclosure are not limited to the aforementioned effects, and various other effects are included in the present specification.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
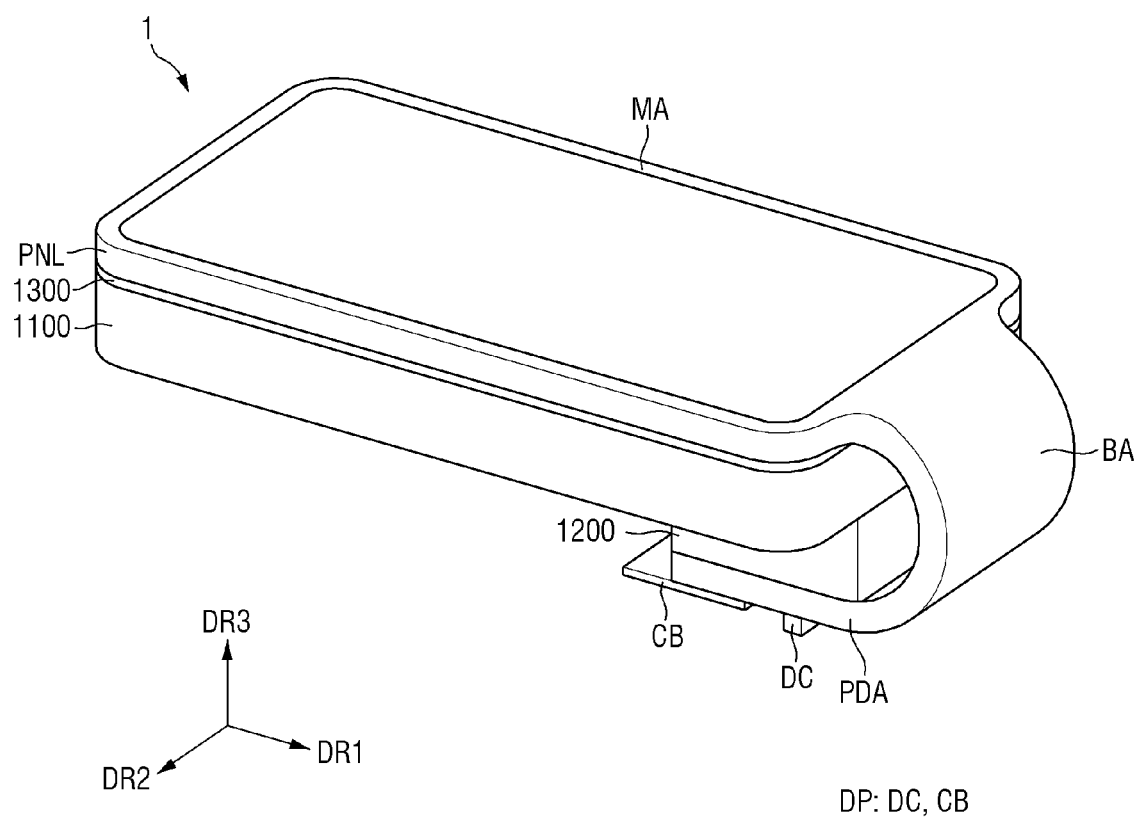
FIG. 1 is a perspective view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no intervening layer is present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

Figure 2:
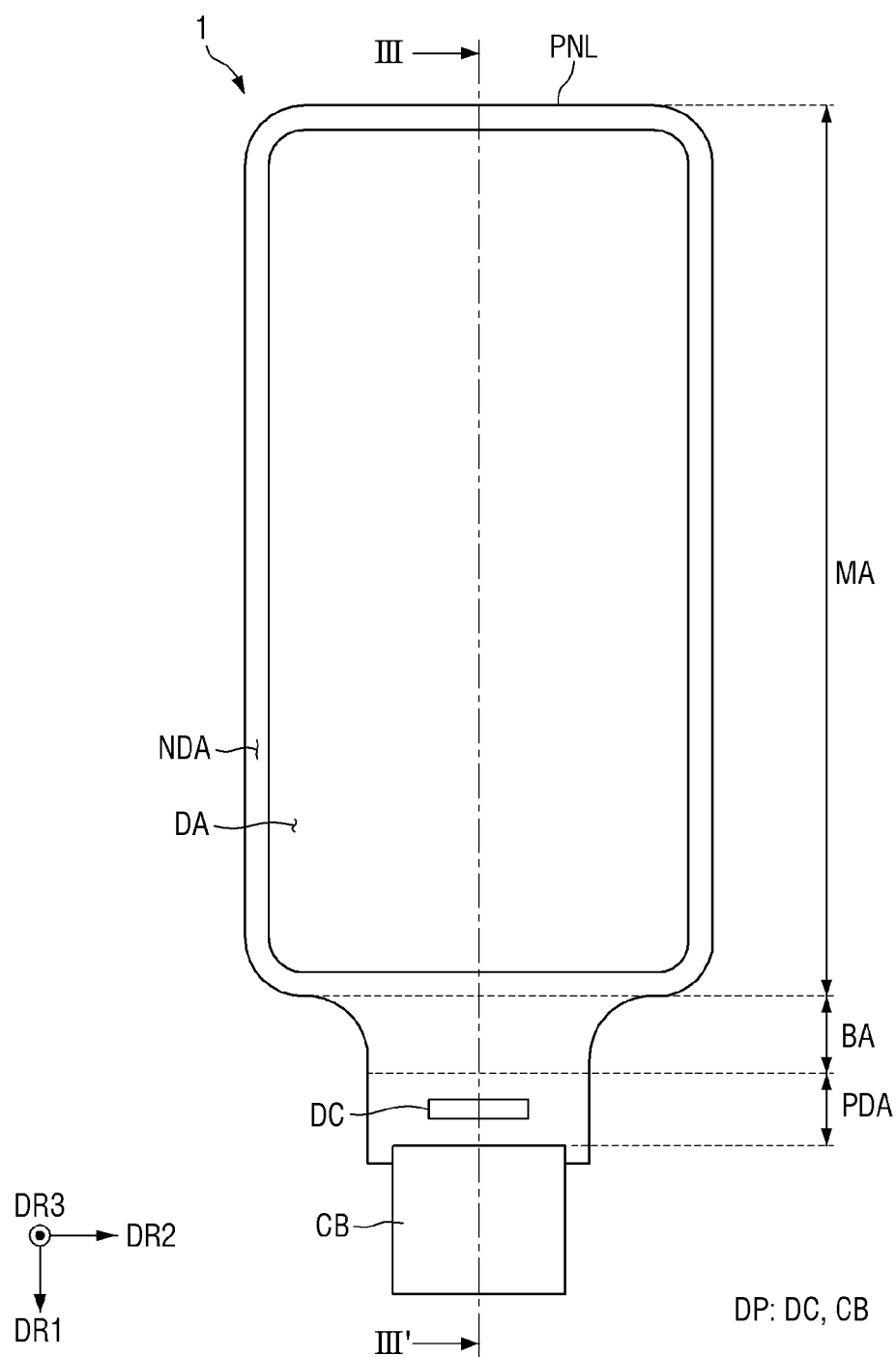
FIG. 2 is a plan view of an embodiment of the display device of FIG. 1.
Figure 3:
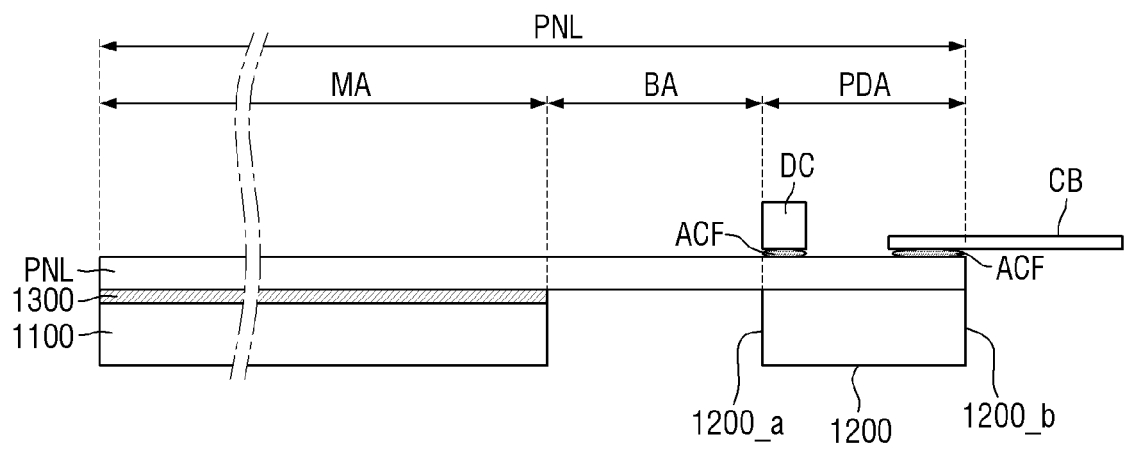
FIG. 3 is a cross-sectional view of the display device of FIG. 2 taken along line III-III'.
Figure 4:
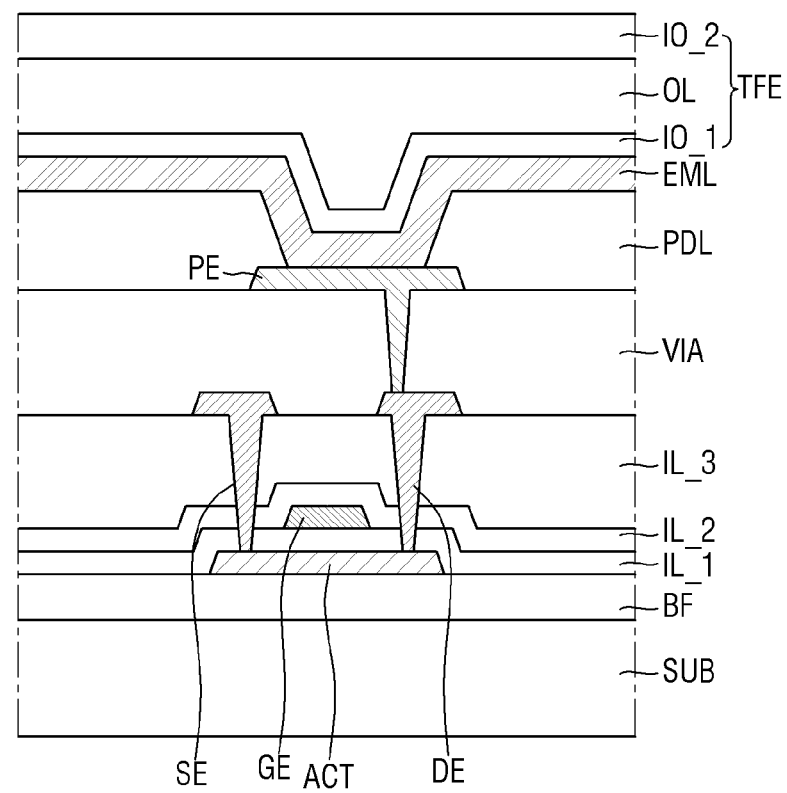
FIG. 4 is an enlarged cross-sectional view illustrating an embodiment of a pixel in a main area of the display device.
Figure 4:
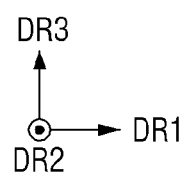
Figure 5:
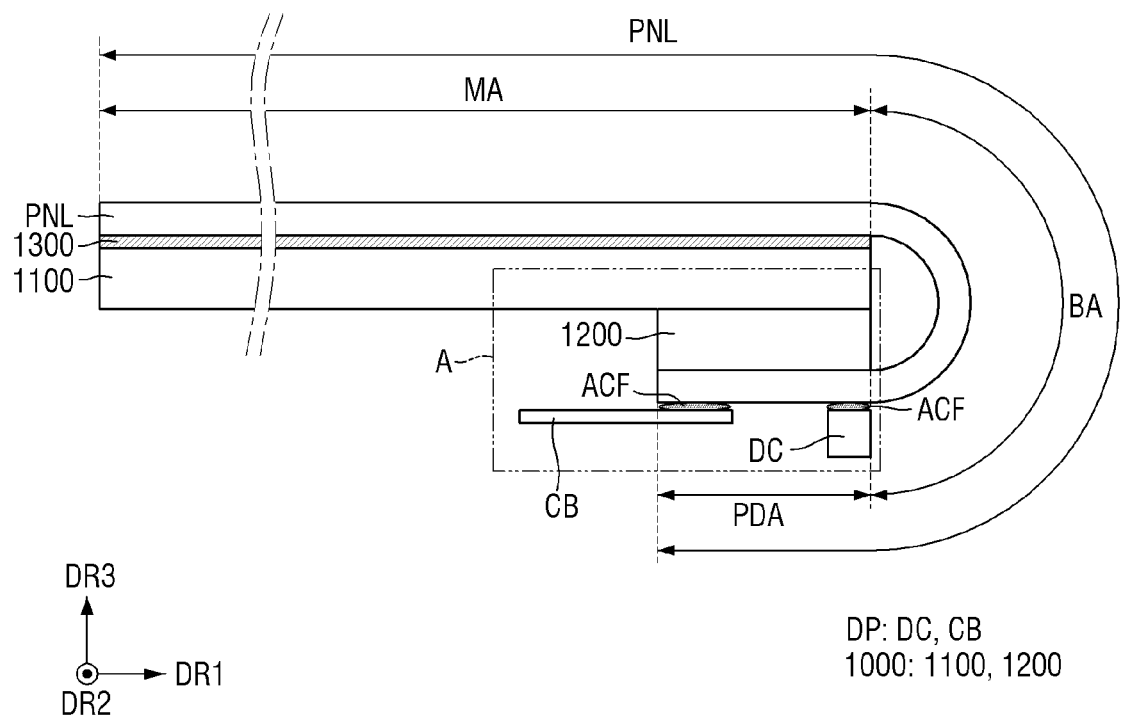
FIG. 5 is a cross-sectional view illustrating an embodiment of the display device of FIG. 1 which is bent.
Figure 6:
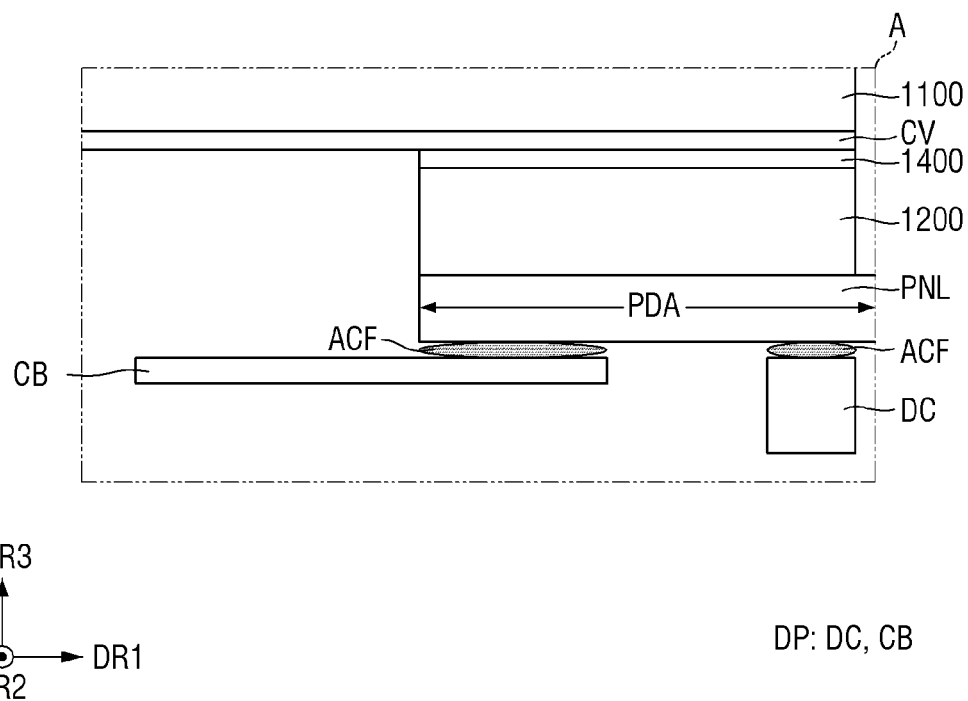
FIG. 6 is an enlarged cross-sectional view of area A of FIG. 5.

FIG. 1 is a perspective view of an embodiment of a display device 1. FIG. 2 is a plan view of an embodiment of the display device 1 of FIG. 1. FIG. 3 is a cross-sectional view of the display device 1 of FIG. 2 taken along line FIG. 4 is a schematic view illustrating an embodiment of a pixel in a main area of a display device. FIG. 5 is a plan view illustrating an embodiment of the display device 1 which is bent of FIG. 1. FIG. 6 is an enlarged plan view of area A of FIG. 5.

Referring to FIGS. 1 and 2, a display device 1 is an electronic device that displays a moving image or a still image, and may be used as a display screen of various electronic device products such as televisions, laptop computers, and monitors, as well as portable electronic devices such as smartphones, tablet personal computers (PCs), mobile communication terminals, and electronic books.

The display device 1 has a three-dimensional shape. In the drawings, a first direction DR1 refers to a direction parallel to a first side (vertical side) of the display device 1, a second direction DR2 refers to a direction parallel to a second side (horizontal side) of a display device 1, and a third direction DR3 crosses each of the first direction DR1 and the second direction DR2 and refers to a thickness direction of the display device 1 (or various components or layers thereof). In the following specification, unless otherwise specified, the term "direction" may refer to both of opposing directions extending along the direction. In addition, when the opposing are distinguished from each other, one side will be referred to as "one side in the direction" and the other side will be referred to as "the other side in the direction."

In FIG. 1, an arrow direction will be referred to as one side, and an opposite direction to the arrow direction will be referred to as the other side. The first direction DR1, the second direction DR2 and the third direction DR3 may intersect each other, such as to be perpendicular to each other, respectively. The display device 1 may have a shape in which a vertical side thereof is longer than a horizontal side as illustrated in FIGS. 1 and 2, but is not limited thereto.

Referring to FIGS. 3 to 6, the display device 1 may include a display panel PNL, a lower support body 1000, and a driving part DP.

The display panel PNL is a panel that displays an image, and any type of display panel PNL such as an organic light emitting display panel including an organic emission layer (EML), a micro light emitting diode display panel using a micro light emitting diode (LED), a quantum dot light emitting display panel using a quantum dot light emitting diode including a quantum dot emission layer (EML), and an inorganic light emitting display panel using an inorganic light emitting element including an inorganic semiconductor, may be applied as the display panel PNL within the display device 1. Hereinafter, a case where the display panel PNL of the display device 1 is an organic light emitting display panel will be mainly described. The display panel PNL may include a display screen on one side thereof, furthest in the third direction DR3.

The display panel PNL may include a flexible substrate SUB including a flexible polymer material such as polyimide. Accordingly, the display panel PNL may be flexibly formed to be partially bent, folded, or rolled (e.g., bendable, rollable, slidable, foldable, etc.) according to various platforms of the display device 1.

One surface of the display panel PNL may be an upper surface at which a display area DA displaying an image is disposed, and the other surface of the display panel PNL which is opposite to the one surface, may be a lower surface on which the lower support body 1000 to be described later is disposed.

The display panel PNL may include a main area MA, a pad area PDA disposed on one side of the main area MA in the first direction DR1, and a bending area BA disposed between the main area MA and the pad area PDA. The display panel PNL may be flexible (e.g., bendable) at the bending area BA.

The main area MA may have a shape (e.g., planar) substantially similar to an overall shape (e.g., overall planar shape) of the display device 1 in a plan view. The main area MA may be a flat area positioned in one plane. The plane may be defined by the first direction DR1 and the second direction DR2 crossing each other. However, the disclosure is not limited thereto, and at least one of edge portions of the main area MA other than an edge portion corresponding to a side at which the main area MA is connected to the bending area BA, may be bent to have a curved surface or may be bent in a vertical direction such as along the third direction DR3.

When a portion of the display panel PNL in which pixels are disposed to generate and/or display an image is defined as the display area DA, and a portion in which an image is not displayed is defined as a non-display area NDA, the display area DA of the display panel PNL is disposed in the main area MA. Specifically, the display area DA may be positioned at a central portion of the main area MA except for edge portions of the main area MA. A remaining portion of the display panel PNL, other than the display area DA, becomes the non-display area NDA of the display panel PNL. In an embodiment, a peripheral portion of the main area MA which is outside the display area DA, the entire bending area BA, and the entire pad area PDA may be the non-display area NDA. However, the disclosure is not limited thereto, and the bending area BA and/or the pad area PDA may also include a portion of the display area DA.

The display area DA disposed at the central portion of the main area MA may have a rectangular shape or a rectangular shape with rounded corners, in a plan view. However, the disclosure is not limited thereto, and the display area DA may have various shapes such as a square shape or other polygonal shapes, a circular shape, and an elliptical shape.

A plurality of pixels may be disposed in the display area DA disposed at the central portion of the main area MA. Referring to FIG. 4, the pixel may include a flexible substrate SUB, a buffer layer BF, a semiconductor pattern layer ACT, a first insulating film IL_1, a second insulating film IL_2, a third insulating film IL_3, a gate electrode GE, a source electrode SE, a drain electrode DE, a via insulating film VIA, a pixel defining film PDL, an emission layer EML, a pixel electrode PE, a counter electrode, a thin film encapsulation layer TFE, and the like.

The buffer layer BF may be disposed on an entirety of the flexible substrate SUB, and the semiconductor pattern layer ACT may be disposed on the buffer layer BF in the display area DA.

The first insulating film IL_1 may be disposed on the buffer layer BF on which the semiconductor pattern layer ACT is disposed, and may be disposed to have substantially the same thickness along a profile of the semiconductor pattern layer ACT. The gate electrode GE may be disposed on the first insulating film IL_1, and the second insulating film IL_2 may cover the gate electrode GE on the first insulating film IL_1 on which the gate electrode GE is disposed, and may be disposed to have substantially the same thickness along a profile of the gate electrode GE as a gate pattern.

A third insulating film IL_3 may be disposed on the second insulating film IL_2. The third insulating film IL_3 may not generate a step around the gate electrode GE by sufficiently covering the gate electrode GE, and have a substantially flat planar surface.

The source electrode SE and the drain electrode DE may be disposed on the third insulating film IL_3. The source electrode SE may be electrically connected to the semiconductor pattern layer ACT through a contact hole formed (or provided) through the third insulating film IL_3, the second insulating film IL_2, and the first insulating film IL_1. The drain electrode DE may be electrically connected to the semiconductor pattern layer ACT through a contact hole formed through the third insulating film IL_3, the second insulating film IL_2, and the first insulating film IL_1.

The via insulating film VIA may be disposed on the third insulating film IL_3, and the emission layer EML may be disposed on the via insulating film VIA. Although not illustrated, the emission layer EML may have a multilayer structure including an organic emission layer (EML), a hole injection layer (HIL), a hole transport layer (HTL), an electron transport layer (ETL), an electron injection layer (EIL), and the like.

The pixel electrode PE may be disposed on the via insulating film VIA. The pixel electrode PE may be electrically connected to the drain electrode DE through a via hole formed through the via insulating film VIA.

The pixel defining film PDL may be disposed on the via insulating film VIA on which the pixel electrode PE is disposed. The pixel defining film PDL may include or define an opening formed to partially expose the pixel electrode PE to outside the pixel defining film PDL. Within the pixel, a display region may be distinguished from a non-display region, by the opening of the pixel defining film PDL. The display region and the non-display region may be considered portions of a display area DA and a non-display area NDA, respectively, without being limited thereto. Although not illustrated in the drawings, the counter electrode may be disposed on the emission layer EML and have substantially the same profile as the emission layer EML.

The thin film encapsulation layer TFE may be disposed on the emission layer EML. The thin film encapsulation layer TFE may prevent (or effectively reduce) permeation of external moisture and oxygen to other components or layers of the display panel PNL. The thin film encapsulation layer TFE may include at least one organic layer OL and one inorganic layer. At least one organic layer OL and at least one inorganic layer may face each other and be alternately stacked. In an embodiment, for example, the thin film encapsulation layer TFE may include a first inorganic layer IO_1, a second inorganic layer IO_2 facing the first inorganic layer IO_1, and an organic layer OL disposed between the first inorganic layer IO_1 and the second inorganic layer IO_2, but is not limited thereto.

The non-display area NDA of the main area MA may extend from an outer boundary of the display area DA to an outer edge of the display panel PNL (e.g., an edge furthest from the display area DA). Signal lines or driving circuits for applying signals to the display area DA may be disposed in the non-display area NDA of the main area MA. In addition, an outermost black matrix may be disposed in the non-display area NDA of the main area MA, but is not limited thereto.

The bending area BA is connected to or extend from one side of the main area MA, in the first direction DR1. In an embodiment, for example, the bending area BA may meet or be connected to the main area at a short side of the main area MA. A width of various regions of the display panel PNL may be defined along the second direction DR2. A width of the bending area BA may be smaller than a width of the short side of the main area MA. A connection portion between the main area MA and the bending area BA may have an L-shaped cut shape. The signal lines extending from the non-display area NDA of the main area MA, may pass through the bending area BA.

In the bending area BA, the display panel PNL may be bendable toward the other side in the third direction DR3, to define a curvature. Various components or layers of the display panel PNL may be bendable together with each other and/or other components or layers of the display device 1. The display panel PNL which is bent may dispose the bending area BA bent to have a constant radius of curvature, but is not limited thereto and the bending area BA which is bent may also have different radii of curvature for each section. The display panel PNL which is bent in the bending area BA, may dispose a surface of the display panel PNL inverted (e.g., facing in a direction opposite to an original direction). That is, before the bending area BA is bent, one surface of the pad area PDA may face one side in the third direction DR3, and the bending area BA which is bent toward the other side in the third direction DR3 may dispose the one surface of the pad area PDA facing the other side in the third direction DR3. In this case, the pad area PDA may be disposed on the other side of the display panel PNL in the third direction DR3 to overlap the main area MA of the display panel PNL along the thickness direction.

The pad area PDA extends from the bending area BA. The pad area PDA may extend from a point a bend or curvature of the bending area BA terminates, in a direction parallel to the main area MA. In this case, the pad area PDA may overlap the main area MA in the third direction DR3. Specifically, the pad area PDA may overlap the non-display area NDA at the edge of the main area MA, and further overlap the display area DA of the main area MA.

A plurality of pads electrically connected to a driving part DP to be described later may be disposed in the pad area PDA.

A width of the pad area PDA in the second direction DR2 may be the same as the width of the bending area BA in the second direction DR2, but is not limited thereto.

The driving part DP may serve to provide various signals (e.g., electrical signals, voltages, etc.) for driving the display panel PNL. The driving part DP may include a display driving circuit DC and a display circuit board CB. The driving part DP may be mounted on the display panel PNL at the pad area PDA of the display panel PNL.

The display driving circuit DC and the display circuit board CB may serve to output signals and voltages for driving the display panel PNL, respectively. The display driving circuit DC and the display circuit board CB may be electrically connected to the pads of the pad area PDA by one or more anisotropic conductive films ACF to provide driving signals to data lines, gate lines, power lines, and the like. The display driving circuit DC may be implemented as an integrated circuit (IC). The display circuit board CB may be a flexible printed circuit board (FPCB), a printed circuit board (PCB), or the like.

The lower support body 1000 may serve to support the display panel PNL and to improve overall mechanical strength of the display panel PNL. The lower support body 1000 may be disposed under the main area MA and the pad area PDA of the display panel PNL. That is, the lower support body 1000 may face the main area MA and the pad area PDA of the display panel PNL. The lower support body 1000 may include a flexible support part 1100 and a rigid support part 1200. The flexible support part 1100 and the rigid support part 1200 may together form a lower support layer.

The flexible support part 1100 may be disposed under the main area MA of the display panel PNL to support the display panel PNL. The flexible support part 1100 may overlap an entirety of the main area MA in the third direction DR3. The flexible support part 1100 may be attached to a lower surface of the main area MA of the display panel PNL which is closest to the lower support body 1000, such as by an adhesive member 1300 interposed between the flexible support part 1100 and the main area MA of the display panel PNL, as illustrated in FIG. 3. One surface of the flexible support part 1100 which is closest to the display panel PNL, may be an upper surface on which the adhesive member 1300 is disposed, and the other surface of the flexible support part 1100 which is opposite to the one surface and furthest from the display panel PNL, may be a lower surface on which the adhesive member 1300 is not disposed or omitted.

The adhesive member 1300 may be a pressure sensitive adhesive (PSA), but is not limited thereto. Hereinafter, for convenience of explanation, a case where the adhesive member 1300 is the pressure sensitive adhesive will be mainly described. The pressure sensitive adhesive is a composition in which several compounds are combined with each other, and may include sulfur, fluorine, and the like.

The flexible support part 1100 may be a support film (e.g., flexible support film) having a three-dimensional shape having a planar shape corresponding to a planar shape of the main area MA of the display panel PNL in a plan view and having a thickness in the third direction DR3. In an embodiment, for example, the flexible support part 1100 may have a film shape having a rectangular cross section or a shape similar to the film shape, but is not limited thereto. The flexible support part 1100 may overlap the main area MA of the display panel PNL completely, in a plan view, but is not limited thereto. The flexible support part 1100 may not be disposed in the bending area BA and the pad area PDA. That is, the flexible support part 1100 may be excluded from the bending area BA and the pad area PDA, and may be spaced apart therefrom, without being limited thereto.

The flexible support part 1100 may be flexibly formed to be bendable, foldable and/or rollable. Accordingly, the flexible support part 1100 may be bent, folded, or rolled along with or together with the display panel PNL, according to a platform of the display device 1. The flexible support part 1100 may have various configurations according to the platform of the display device 1. The flexible support part 1100 may be made of (or include), for example, polyethylene terephthalate (PET).

The rigid support part 1200 may be disposed on a lower surface of the pad area PDA of the display panel PNL to support the driving part DP. The rigid support part 1200 may overlap an entirety of or a portion of the pad area PDA, in the third direction DR3. When a portion of a rigid mother substrate MG directly provided such as by coating on a lower surface of the display panel PNL (see FIG. 9) in a process of manufacturing (or providing) the display device 1 to be described later remains to form the rigid support part 1200, a separate adhesive member may not be disposed between the rigid support part 1200 and the lower surface of the display panel PNL, unlike the flexible support part 1100. That is, one surface of the rigid support part 1200 may be in direct contact with a lower surface of the flexible substrate SUB. As being in direct contact, elements may form an interface therebetween, without being limited thereto.

The rigid support part 1200 may be a support glass having a three-dimensional shape having a planar shape corresponding to a planar shape of the pad area PDA in a plan view, and having a thickness in the third direction DR3. The flexible support film may have more flexibility than the support glass. The thickness of the rigid support part 1200 may be equal to or smaller than a sum of a thickness of the flexible support part 1100 in the third direction DR3 and a thickness of the adhesive member 1300 in the third direction DR3. A case where the thickness of the rigid support part 1200 is the same as the sum of the thickness of the flexible support part 1100 and the thickness of the adhesive member 1300 has been described by way of example in the present embodiment, but the thickness of the rigid support part 1200 may also be smaller than the sum of the thickness of the flexible support part 1100 and the thickness of the adhesive member 1300.

The rigid support part 1200 has less flexibility than the flexible support part 1100, and may not be deformed well. The rigid support part 1200 may include glass, but is not limited thereto. In an embodiment, for example, the rigid support part 1200 may include quartz, synthetic quartz, soda-lime glass, alkali-free glass, or the like.

The rigid support part 1200 and the flexible support part 1100 may be spaced apart from each other with the bending area BA therebetween. That is, the lower support layer may be disconnected at the bending area BA. In other words, the lower support body 1000 may not be attached to a lower surface of the display panel PNL at the bending area BA. One surface of the rigid support part 1200 may be an upper surface in contact with the display panel PNL, and the other surface of the rigid support part 1200 opposing the one surface may be a lower surface not in contact with the display panel PNL.

In addition, the rigid support part 1200 may include a first side surface 1200_a facing the flexible support part 1100 and a second side surface 1200_b facing an opposite direction to a direction that the first side surface 1200_a faces, as illustrated in FIG. 3. In the display device 1 which is not bent (e.g., unbent) may, the second side surface 1200_b of the rigid support part 1200 may be aligned with an end surface of the display panel PNL at a distal end of the pad area PDA which is furthest from the main area MA of the display panel PNL in the first direction DR1. The second side surface 1200_b of the rigid support part 1200 may be coplanar with the end surface of the display panel PNL.

The side surfaces 1200_a and 1200_b, and the other surface of the rigid support part 1200 which is furthest from the display panel PNL, may have different surface roughnesses defined by processes in providing the display device 1 to be described later. The surface roughness of the other surface of the rigid support part 1200 may be smaller than that of the side surfaces 1200_a and 1200_b of the rigid support part 1200. That is, the other surface of the rigid support part 1200 may be smoother than the opposing side surfaces of the rigid support part 1200.

When the bending area BA of the display panel PNL is bent toward the other side in the third direction DR3 as illustrated in FIG. 5, one surface of the rigid support part 1200 faces one surface of the flexible support part 1100. The bending area BA which is bent may define an end portion of the display panel PNL which is bent at the bending area. An adhesive member 1400 may be interposed between the one surface of the rigid support part 1200 and the one surface of the flexible support part 1100 and bond the rigid support part 1200 and the flexible support part 1100 to each other to stably fix a bending structure at the end portion of the display panel PNL. The adhesive member 1400 may be a pressure sensitive adhesive, but is not limited thereto.

The display device 1 may further include a panel lower member CV attached to the lower surface of the flexible support part 1100. The panel lower member CV is disposed to overlap the main area MA and/or the flexible support part 1100 of the display panel PNL. The panel lower member CV is not disposed under the bending area BA and the pad area PDA of the display panel PNL, and may expose the bending area BA and the pad area PDA to outside the display panel PNL.

One surface of the panel lower member CV may be referred to as an upper surface on which the flexible support part 1100 is disposed, and the other surface of the panel lower member CV which opposes the one surface may be referred to as a lower surface.

The panel lower member CV includes one or more of a functional layer. The functional layer may be a layer performing a heat dissipation function, an electromagnetic wave shielding function, a grounding function, a buffer function, a strength reinforcement function, a support function, a digitizing function, and the like. The functional layer may be a sheet layer, a film layer, a thin film layer, a coating layer, a panel, a plate, or the like. One functional layer may be formed as a single layer or may be formed as a plurality of thin films or coating layers that are stacked.

The lower surface of the panel lower member CV includes an area (e.g., a planar area) to which the rigid support part 1200 is attached, as illustrated in FIG. 6, and the adhesive member 1400 as described above may be separately disposed in the area at which the rigid support part 1200 is attached. The panel lower member CV may be attached to the rigid support part 1200 by the adhesive member 1400. A planar area of the adhesive member 1400 may be the same as a planar area of the other surface of the rigid support part 1200, but is not limited thereto.

In the display device 1 according to an embodiment, there is no deformation of the rigid support part 1200 even under high-temperature and high-pressure conditions in a process of mounting the display driving circuit DC and the display circuit board CB due to the configuration as described above. Since there is no deformation of the rigid support part 1200 even under high-temperature and high-pressure conditions, defects such as line cracks may be decreased, and a condition of the anisotropic conductive films ACF (e.g., whether or not conductive balls in the anisotropic conductive films ACF are dented by the rigid support part 1200 that is transparent) may be observable, such that monitoring of a mounting quality the display driving circuit DC and the display circuit board CB may be enhanced.

Hereinafter, an embodiment of a method of manufacturing (or providing) the display device 1 will be described in detail.

A process of manufacturing (or providing) the display device 1 according to an embodiment may be largely divided into mother unit processes and module unit processes. Specifically, one or more embodiment of the display device 1 may be manufactured by scribing a resulting product subjected to all the mother unit processes to obtain a plurality of cells C, and then subjecting each of the obtained cells C to the module unit processes. For convenience of explanation, the mother unit processes will be first described.

Figure 7:
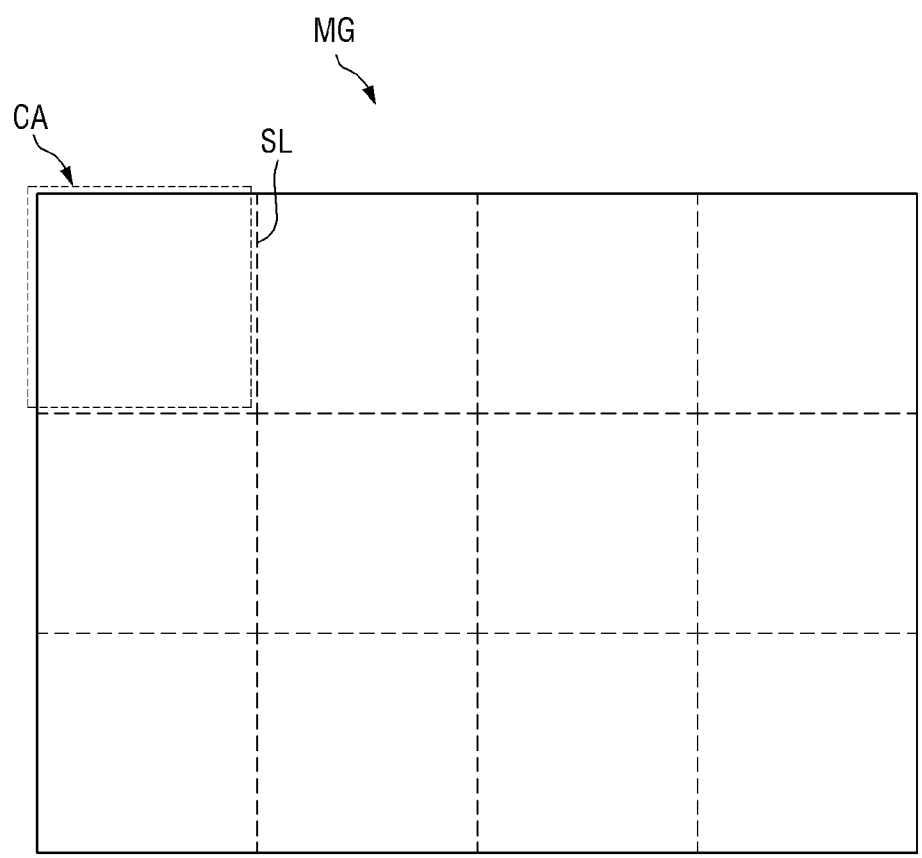
FIG. 7 is a plan view illustrating an embodiment of a rigid mother substrate for providing the display device.
Figure 8:
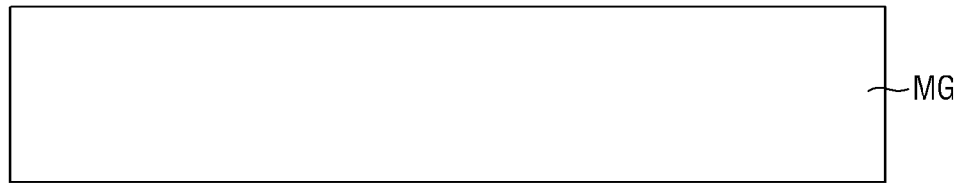
FIGS. 8 and 9 are cross-sectional views illustrating an embodiment of a process of providing a display panel on the rigid mother substrate.
Figure 8:
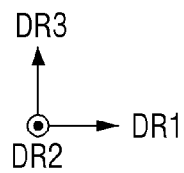
Figure 9:
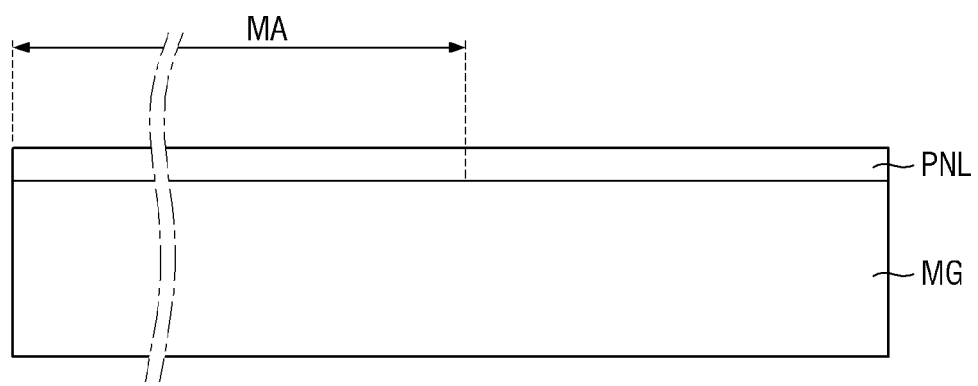
Figure 9:
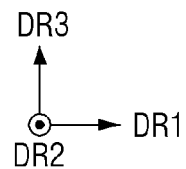
Figure 10:
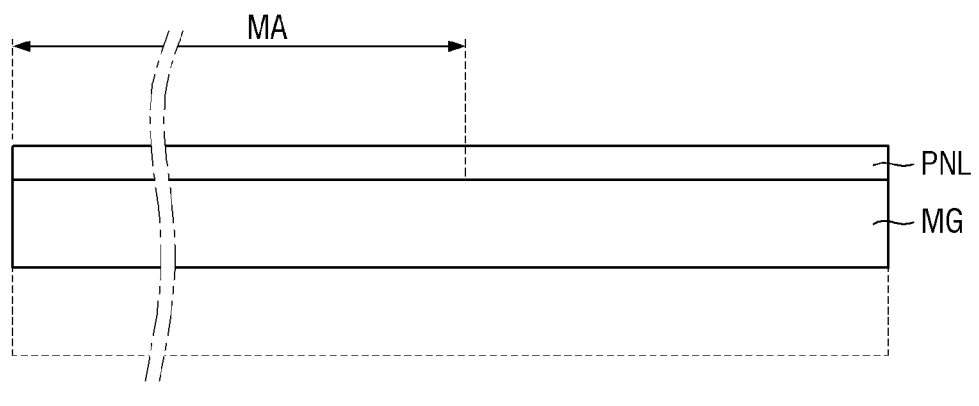
FIG. 10 is a cross-sectional view illustrating an embodiment of a process of etching the rigid mother substrate.
Figure 10:
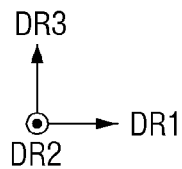
Figure 11:
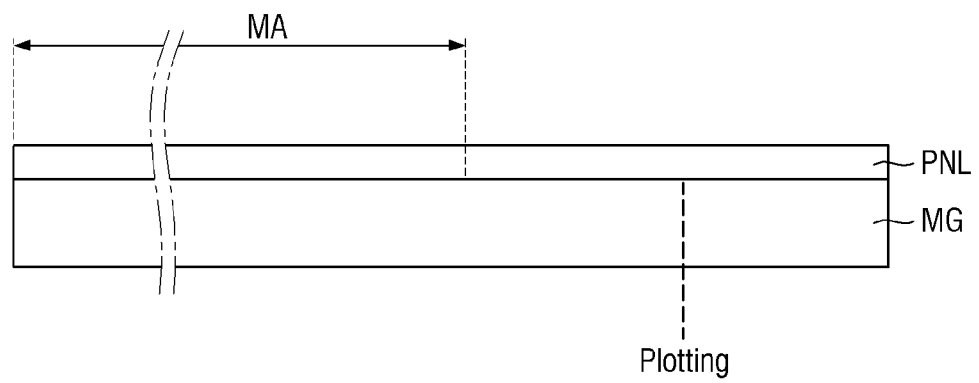
FIG. 11 is a cross-sectional view illustrating an embodiment of a plotting process performed on the rigid mother substrate.
Figure 11:
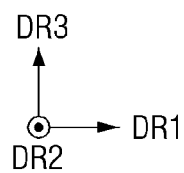
Figure 12:
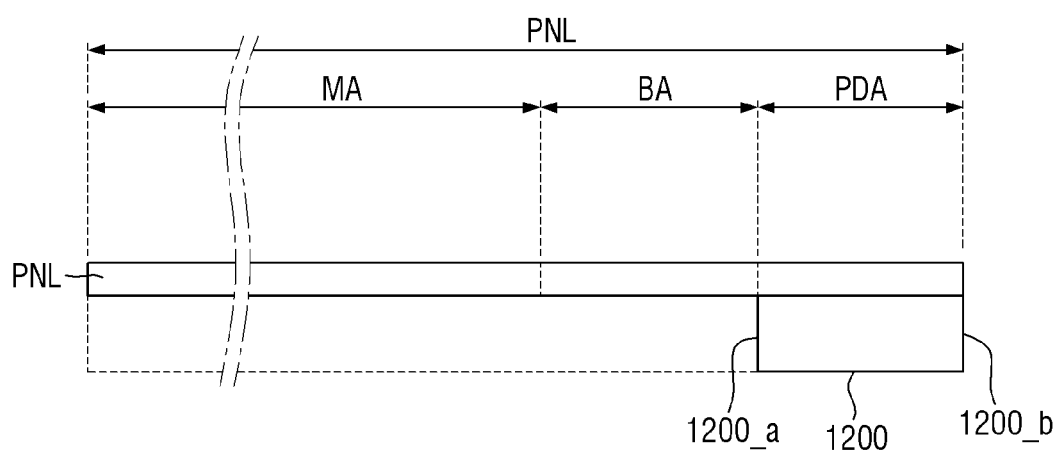
FIG. 12 is a cross-sectional view illustrating an embodiment of a process of removing a portion of the rigid mother substrate.
Figure 12:
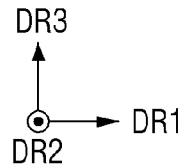
Figure 13:
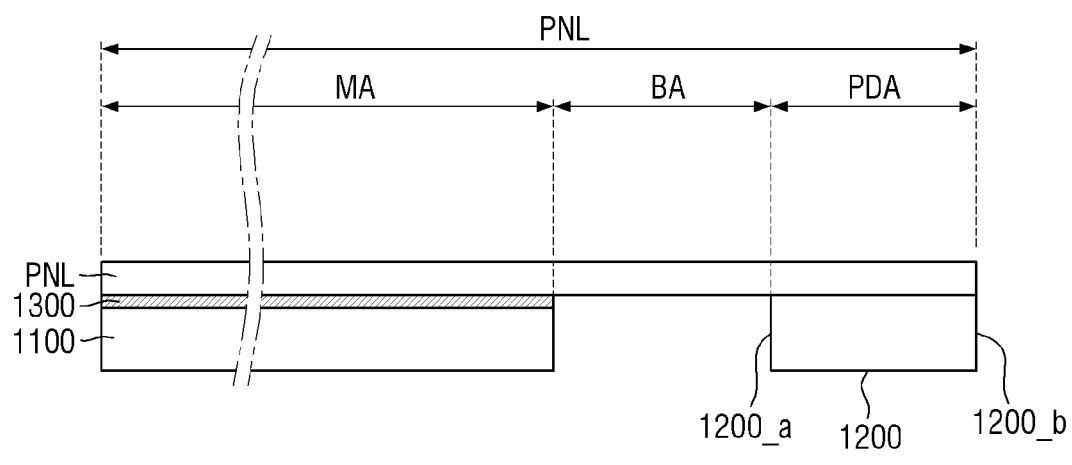
FIG. 13 is a cross-sectional view illustrating an embodiment of a process of providing a flexible support part on a lower surface of a main area of the display panel.
Figure 13:
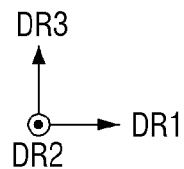
Figure 14:
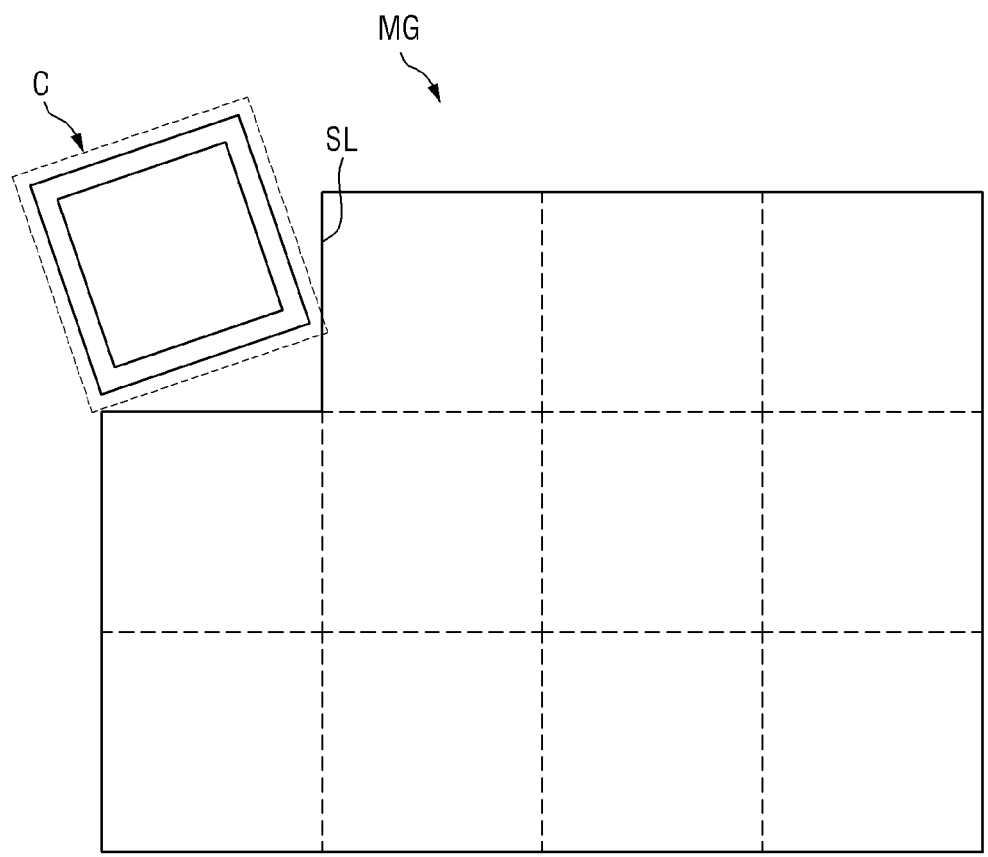
FIG. 14 is a plan view illustrating an embodiment of a process of obtaining cells by cutting a resulting product of mother unit processes along scribing lines.
Figure 14:
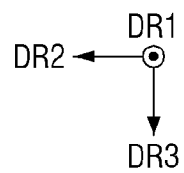

FIG. 7 is a plan view illustrating an embodiment of a rigid mother substrate MG for manufacturing the display device 1 of FIG. 1. FIGS. 8 and 9 are cross-sectional views illustrating an embodiment of a process of disposing a display panel PNL on the rigid mother substrate MG. FIG. 10 is a cross-sectional view illustrating an embodiment of a process of etching the rigid mother substrate MG. FIG. 11 is a cross-sectional view illustrating an embodiment of a plotting process performed on the rigid mother substrate MG. FIG. 12 is a cross-sectional view illustrating an embodiment of a process of removing a portion of the rigid mother substrate MG. FIG. 13 is a cross-sectional view illustrating an embodiment of a process of disposing a flexible support part 1100 on a lower surface of a main area MA of the display panel PNL. FIG. 14 is a cross-sectional view illustrating an embodiment of a process of obtaining cells by cutting a resulting product of mother unit processes along scribing lines SL.

Referring to FIG. 7, mother unit processes are performed on a rigid mother substrate MG. Specifically, a plurality of display devices 1 FIG. 1 may be simultaneously manufactured by performing the mother unit processes on the rigid mother substrate MG having a plurality of cell areas CA.

The rigid mother substrate MG may have a rectangular shape as illustrated in FIG. 7, but is not limited thereto. One surface of the rigid mother substrate MG may be an upper surface on which a display panel PNL to be described later is disposed, and the other surface of the rigid mother substrate MG opposing the one surface may be a lower surface on which the display panel PNL is not disposed.

The rigid mother substrate MG may include glass, but is not limited thereto. In an embodiment, for example, the rigid mother substrate MG may be made of or include quartz, synthetic quartz, soda-lime glass, alkali-free glass, or the like. Hereinafter, for convenience of explanation, a case where the rigid mother substrate MG is made of glass will be mainly described.

The plurality of cell areas CA of the rigid mother substrate MG may be arranged in a matrix direction. Scribing lines SL as illustrated by chain lines in FIG. 6 may be defined between the plurality of cell areas CA. Each of the cell areas CA may correspond to a display panel PNL (or a display device 1). Scribing lines SL may correspond to outer edges of the display panel PNL (or the display device 1).

Referring to FIGS. 8 and 9, the rigid mother substrate MG is prepared, and a display panel PNL is formed (or provided) on the rigid mother substrate MG. Specifically, a polyimide layer (e.g., a flexible substrate SUB) is stacked on the rigid mother substrate MG. Since the polyimide layer is directly coated or deposited on the rigid mother substrate MG, a lower surface of the polyimide layer may be in direct contact with the one surface of the rigid mother substrate MG, such as to form an interface therebetween. In order to stably stack the polyimide layer, a thickness of the rigid mother substrate MG in the third direction DR3 is sufficient to support the polyimide layer. In an embodiment, the thickness of the rigid mother substrate MG may be about 400 micrometers (μm) or more. The thickness of the rigid mother substrate MG may be greater than thicknesses of a flexible support part 1100 and an adhesive member 1300 to be described later.

The polyimide layer on the rigid mother substrate MG is used as a flexible substrate SUB, and the various insulating films, conductive films, conductive lines (e.g., signal lines), and the like, described above with reference to FIG. 4 are formed on the flexible substrate SUB. A specific process of forming the display panel PNL has been well known in the art, and a detailed description therefor is thus omitted.

Although not illustrated in the drawings, an additional encapsulation process of protecting the display panel PNL from outside thereof may be further performed after the process of disposing the display panel PNL on the rigid mother substrate MG.

Referring to FIG. 10, a lower surface of the rigid mother substrate MG is etched. In an embodiment, an entirety of the lower surface of the rigid mother substrate MG is etched. The lower surface of the rigid mother substrate MG may be etched at areas corresponding to the main area MA, the bending area BA and the pad area PDA of the display panel PNL. The etching of the rigid mother substrate MG reduces a thickness thereof, to define a reduced thickness. In an embodiment, where an entirety of the lower surface of the rigid mother substrate MG is etched, the thickness of the rigid mother substrate MG is decreased across an entirety of a planar area thereof, through such an etching process. The etching process may be performed until the thickness of the rigid mother substrate MG becomes equal to (or smaller than) a thickness of a flexible support part 1100 to be described later. Specifically, the rigid mother substrate MG may be etched so that the thickness thereof becomes about 200 μm or less.

A wet etching process using an etchant may be performed as the etching process. In an embodiment, the display panel PNL is encapsulated by the thin film encapsulation layer TFE at a point in time when the etching process is performed, and thus, elements inside the display panel PNL may not be exposed to the etchant of the etching process. Furthermore, when an additional encapsulation process is performed on the display panel PNL, damage to the elements inside the display panel PNL due to the etchant may be more effectively prevented.

The other surface of the rigid mother substrate MG which is etched by the etching process may have a first surface roughness. The rigid mother substrate MG which is etched may define an etched mother substrate.

A plotting process using a laser is performed on the etched mother substrate in order to divide the bending area BA and the pad area PDA of the display panel PNL, as illustrated in FIG. 11. In an embodiment, for example, in the plotting process, the rigid mother substrate MG as the etched mother substrate, is irradiated with the laser in the third direction DR3, such that the rigid mother substrate MG may be at least partially scribed. When the rigid mother substrate MG is partially scribed by performing the plotting process, the bending area BA and the pad area PDA of the display panel PNL are divided on the basis of the scribed portion of the rigid mother substrate MG. A boundary between the bending area BA and the pad area PDA may correspond to a side surface of the rigid mother substrate MG provided in the scribing process. The side surface of the rigid mother substrate MG may correspond to the first side surface 1200_a of the rigid support part 1200.

Referring to FIG. 12, a process of removing portions of the rigid mother substrate MG respectively corresponding to the main area MA and the bending area BA of the display panel PNL, is performed, such as by peeling of the rigid mother substrate MG from the display panel PNL. The peel-off process may be performed using a laser. In an embodiment, for example, when a portion of the rigid mother substrate MG partially scribed by the plotting process and a boundary between the display panel PNL and the rigid mother substrate MG are irradiated with the laser, a bonding force between the flexible substrate SUB of the display panel PNL and the rigid mother substrate MG is weakened by the laser, such that the rigid mother substrate MG may be separated from the display panel PNL. In an embodiment, the lower surface of the display panel PNL which is exposed to outside the glass substrate (e.g., rigid mother substrate MG) at a first area (e.g., main area MA and bending area BA) of the display panel PNL may define an exposed lower surface of the display panel PNL at the first area.

The peel-off of the rigid mother substrate MG by the laser irradiation is performed on the rigid mother substrate MG having the reduced thickness by the etching process, and may thus have high process efficiency. The rigid support part 1200 corresponds to a portion of the rigid mother substrate MG (e.g., a portion of the etched mother substrate), and thus, a configuration of the rigid support part 1200 and a configuration of the rigid mother substrate MG are the same as each other.

The pad area PDA of the display panel PNL is not irradiated with the laser, and thus, a planar area of the rigid mother substrate MG which corresponds to the pad area PDA remains as the rigid support part 1200. That is, the rigid support part 1200 is a remaining portion of the etched mother substrate. Such selective laser irradiation may be performed by a laser scanning method or may be performed by full-surface irradiation using masking. In an embodiment, when mask processing is performed on one area of the rigid mother substrate MG which corresponds to the pad area PDA of the display panel PNL, and the rigid mother substrate MG is entirely irradiated with the laser, the irradiation may not be performed at only the pad area PDA of the display panel PNL.

The other surface of the rigid support part 1200 which is furthest from the display panel PNL along the third direction, is formed through the etching process to have a first surface roughness, and the first side surface 1200_a of the rigid support part 1200 which faces the flexible support part 1100 is formed by the peel-off process to form a second surface roughness. The first surface roughness and the second surface roughness may be different from each other. In more detail, the first surface roughness of the other surface of the rigid support part 1200 may be smaller than the second surface roughness of the first side surface 1200_a of the rigid support part 1200.

Referring to FIG. 13, a process of disposing the flexible support part 1100 on the lower surface of the display panel PNL, at the main area MA of the display panel PNL, is performed. In an embodiment, for example, the adhesive member 1300 is attached onto one surface of the flexible support part 1100, and the flexible support part 1100 to which the adhesive member 1300 is attached is attached to the lower surface of the main area MA of the display panel PNL, such that the flexible support part 1100 is disposed in the main area MA of the display panel PNL. An etched mother substrate including the flexible support part 1100 in the main area MA of the display panel PNL and the rigid support part 1200 in the pad area PDA of the display panel PNL, may define a resulting product of mother unit processes.

Referring to FIGS. 13 and 14, after the process of disposing the flexible support part 1100 on the lower surface of the main area MA of the display panel PNL is performed, a process of obtaining cells C by cutting a resulting product of the mother unit processes along scribing lines SL is performed. In an embodiment, for example, when a laser is irradiated along the scribing lines SL of the resulting product of the mother unit processes, portions of the resulting product of the mother unit processes corresponding to the cell areas CA are separated from a remaining portion of the resulting product of the mother unit processes, such that the cells C are obtained. Each of the cells C may include or correspond to the display panel PNL including the flexible support part 1100 and the rigid support part 1200. In this case, the second side surface 1200_b of the rigid support part 1200 corresponds to the scribing line SL of the resulting product of the mother unit processes. Additionally, the scribing lines SL of the resulting product of the mother unit processes may also correspond to side surfaces (e.g., outer edges) of various layers of the display panel PNL, such as the flexible substrate SUB and one or more of the layers which are on the flexible substrate SUB.

As described above, in one or more embodiment of the process of manufacturing the display device 1 of FIG. 1, processes of manufacturing the display panel PNL and the lower support body 1000 are performed in mother units. Hereinafter, a process of mounting the display driving circuit DC and the display circuit board CB performed as a module unit process will be described in detail.

Figure 15:
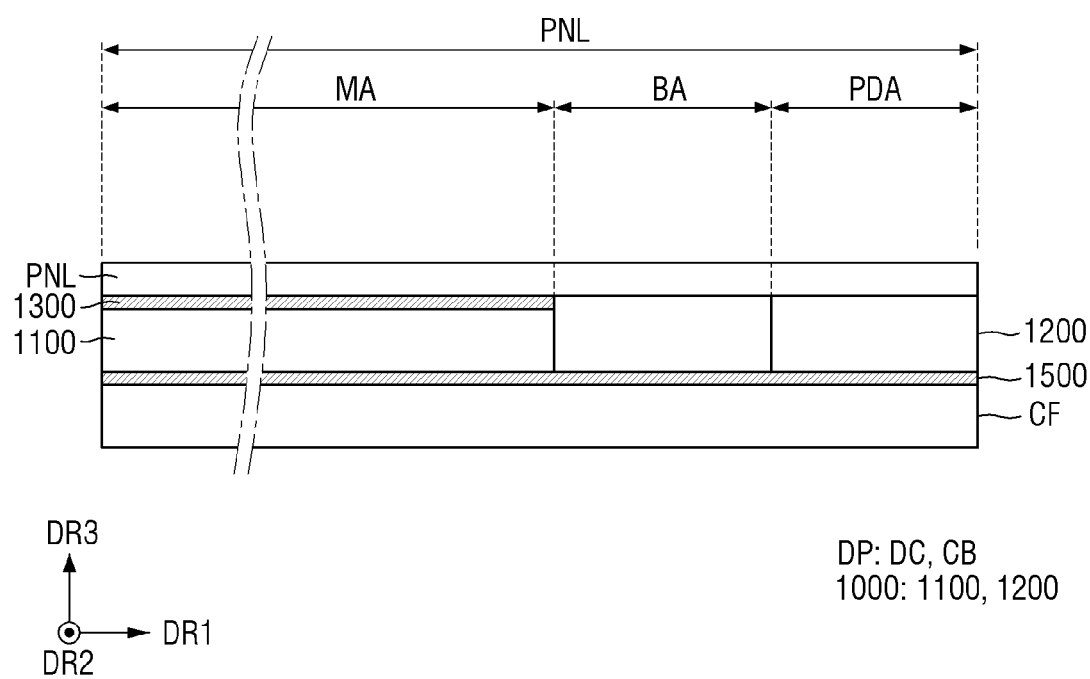
FIG. 15 is a cross-sectional view illustrating an embodiment of a carrier film attached to a lower portion of a lower support body.
Figure 16:
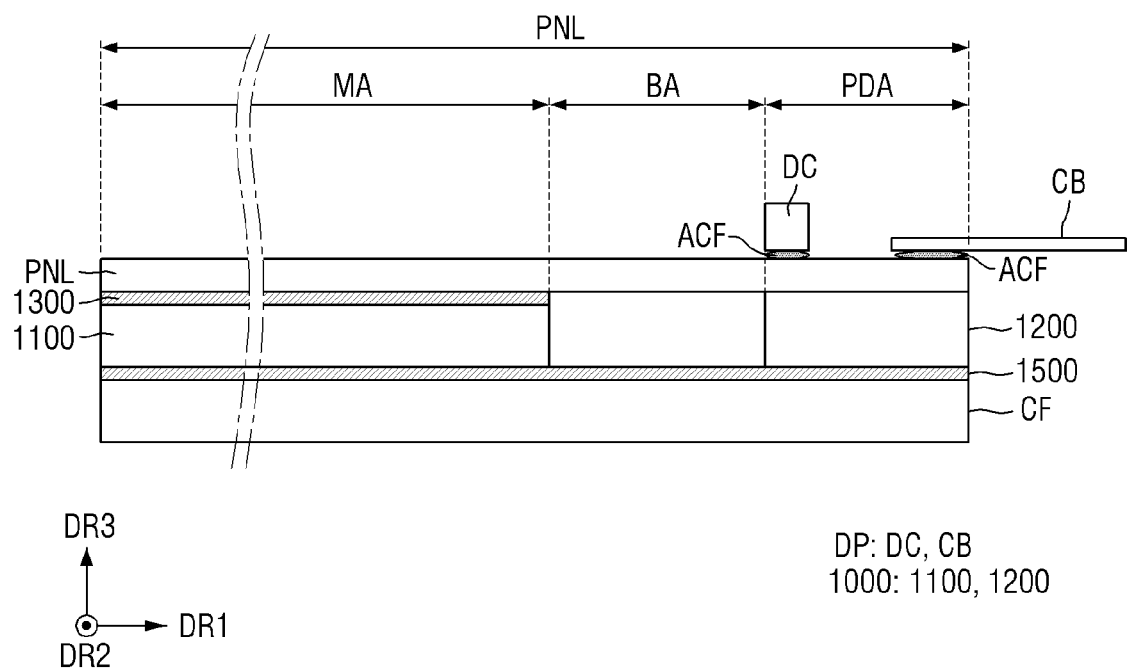
FIG. 16 is a cross-sectional view illustrating an embodiment of a process of mounting a display driving circuit and a display circuit board at a pad area.
Figure 17:
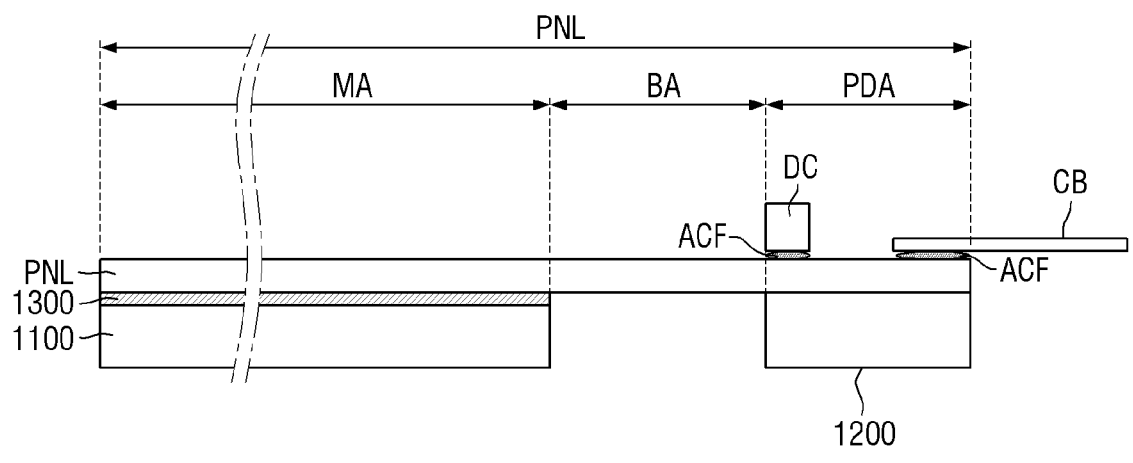
FIG. 17 is a cross-sectional view illustrating an embodiment of a process of mounting a display driving circuit and a display circuit board at a pad area, with the carrier film omitted.

FIG. 15 is a cross-sectional view illustrating an embodiment of a carrier film CF attached to a lower portion of a lower support body 1000. FIG. 16 is a cross-sectional view illustrating an embodiment of a process of mounting a display driving circuit DC and a display circuit board CB on a pad area PDA. FIG. 17 is a cross-sectional view illustrating an embodiment of the carrier film CF removed from the structure in FIG. 16.

Referring to FIG. 15, after the process of obtaining the cells C, a process of attaching a carrier film CF to lower portions of the flexible support part 1100 and the rigid support part 1200 of the display device 1 of FIG. 1, that is, the cell C, is performed.

The carrier film CF may serve to fix the pad area PDA outside of and/or coplanar with the bending area BA. When the carrier film CF is not attached to the other surfaces of the flexible support part 1100 and the rigid support part 1200, the flexible support part 1100 and the rigid support part 1200 may be exposed to outside the cell C, such that a position of the bending area BA of the display panel PNL is not fixed relative to the bending area BA. Accordingly, the carrier film CF may be attached to the other surfaces of the flexible support part 1100 and the rigid support part 1200, respectively, to fix the pad area PDA relative to the bending area BA.

The carrier film CF may have a shape (or planar area) substantially the same as a shape (or planar area), in a plan view, of the display panel PNL which is not bent, but is not limited thereto. The carrier film CF may overlap an entirety of the display panel PNL.

The carrier film CF may be made of polyethylene terephthalate, but is not limited thereto.

A pressure sensitive adhesive is interposed between the carrier film CF and the lower support body 1000 as an adhesive member 1500, and as illustrated in FIG. 15. The carrier film CF is attached onto the other surface of the flexible support part 1100 and the other surface of the rigid support part 1200, by the adhesive member 1500.

Referring to FIG. 16, a process of mounting the driving part DP on the pad area PDA of the display panel PNL by moving the cell C including the flexible support part 1100 and the rigid support part 1200, and the carrier film CF attached to lower portions thereof (e.g., integral with the carrier film CF), is performed.

The display driving circuit DC and the display circuit board CB may be attached to the pad area PDA of the display panel PNL by anisotropic conductive films ACF, as illustrated in FIG. 16. In this case, high-temperature and high-pressure conditions are used during a process of mounting the display driving circuit DC and the display circuit board CB. When the flexible support part 1100 and the adhesive member 1300 are disposed on the lower surface of the pad area PDA of the display panel PNL, the cell may be damaged due to the high-temperature and high-pressure conditions used in the process of mounting the display driving circuit DC and the display circuit board CB. The high-temperature and high-pressure conditions may deform the flexible support part 1100, such that line cracks of the display panel PNL may be caused, and sulfur included in the adhesive member 1300 may be eluted in the form of ions to corrode the display driving circuit DC and the display circuit board CB mounted on the pad area PDA of the display panel PNL, conductive balls of the anisotropic conductive film ACF, or the like, resulting in a chemical defect in the display panel PNL. Accordingly, the defects as described above may be prevented (or effectively reduced) in advance by disposing the rigid support part 1200, which is not deformed by the high-temperature and high-pressure conditions and obviates the use of the adhesive member 1300, at the pad area PDA of the display panel PNL.

In an embodiment, a head tool may be used to provide a high temperature and a high pressure in the process of mounting the driving part DP. A setting temperature of the head tool has a limited maximum value, and as the thickness of the rigid support part 1200 in the third direction DR3 increases, a temperature of the head tool may increase. However, when repeated compression is performed, a time during which a process is not performed is added between a tact time given to the head tool and a subsequent tact time, such that a temperature of the head tool may decrease while the process is not performed. Accordingly, when the temperature of the head tool is increased, maintaining the high temperature for the process of mounting the driving part DP may be difficult. Accordingly, when the thickness of the rigid support part 1200 decreases, the temperature for the head tool decreases, such that the temperature of the head tool may be stably maintained, and thus, stability of the process of mounting the driving part DP may increase. Specifically, the thickness of the rigid support part 1200 in the process of mounting the driving part DP using the head tool may be about 200 μm or less. However, the rigid support part 1200 also serves to support the pad area PDA to increase mechanical strength of the pad area PDA within the cell C, and thus, may have a thickness enough to support the pad area PDA relative to remaining areas of the cell C.

The thickness of the rigid support part 1200 for the process of mounting the driving part DP using the head tool may be smaller than the above-described thickness of the rigid mother substrate MG on which the display panel PNL is formed during mother unit processes. Specifically, the flexible substrate SUB of the display panel PNL is provided when the thickness of the rigid mother substrate MG is sufficiently great, and thus, the thickness of the rigid mother substrate MG during providing of the display panel PNL may be greater than the thickness of the rigid support part 1200 during providing mounting of the driving part DP using the head tool.

The process of mounting the driving part DP may be performed through ultrasonic bonding, in addition to a method that uses the head tool. When the lower surface of the pad area PDA is supported by the rigid support part 1200, an ultrasonic bonding limitation due to absorption of ultrasonic waves by the pressure sensitive adhesive does not occur. Therefore, the process of mounting the display driving circuit DC and the display circuit board CB may be performed through the ultrasonic bonding.

Referring to FIG. 17, the carrier film CF may be removed from the cell C on which the module unit processes have been completed. That is, the carrier film CF and/or the adhesive member 1500 are removably disposed (e.g., removeable), with respect to the cell C.

After the carrier film CF is removed from the cell C, the display device 1 is bent at the bending area BA in an opposite direction to the third direction DR3 to attach the other surface of the rigid support part 1200 to the other surface of the flexible support part 1100, thereby completing the display device 1 as illustrated in FIG. 5.

As described above, one or more embodiment of the process of removing a portion of the rigid mother substrate MG may be performed as the mother unit process to provide a cell C (e.g., display cell), and the process of mounting the display driving circuit DC and the display circuit board CB on the pad area PDA of the display panel PNL may be performed on the cell C, as the module unit process.

In the following embodiments, the same components as those of the above-described embodiment will be denoted by the same reference numerals, and an overlapping description therefor will be omitted or simplified and contents different from those described above will be mainly described.

Figure 18:
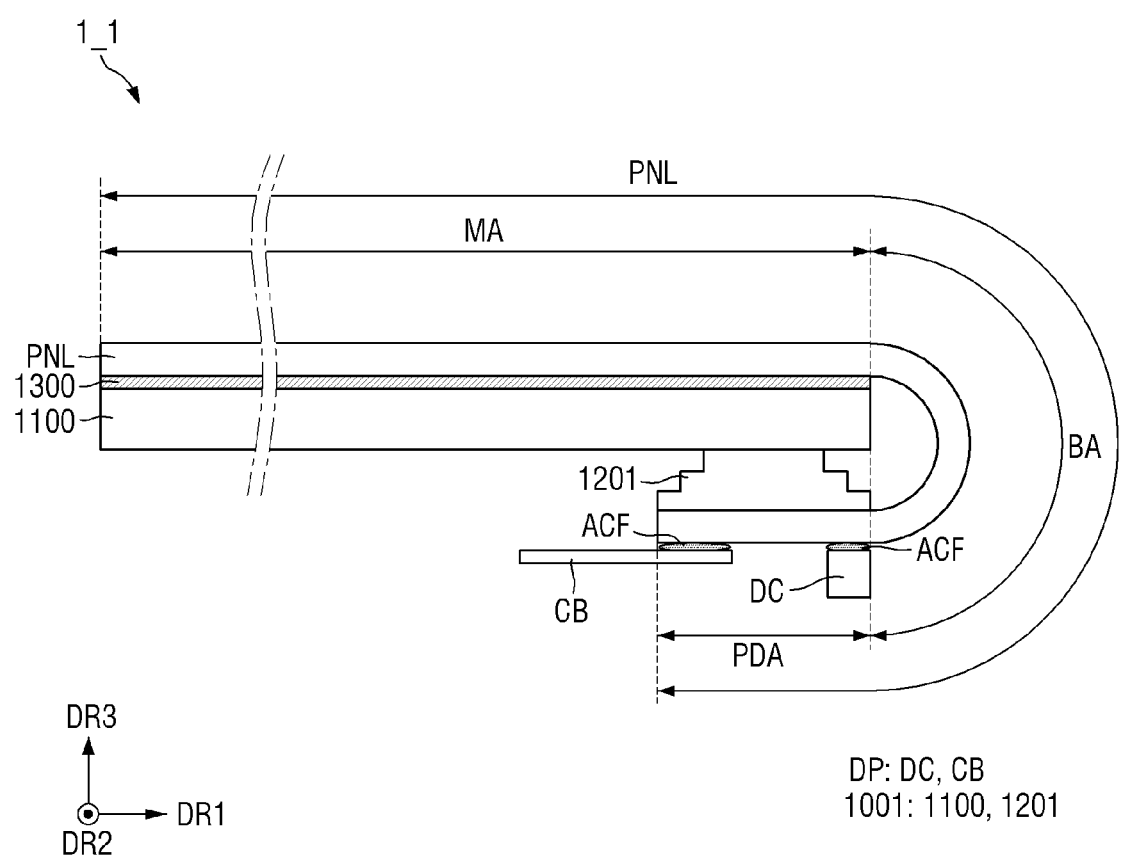
FIG. 18 is a cross-sectional view illustrating an embodiment of a display device which is bent.
Figure 19:
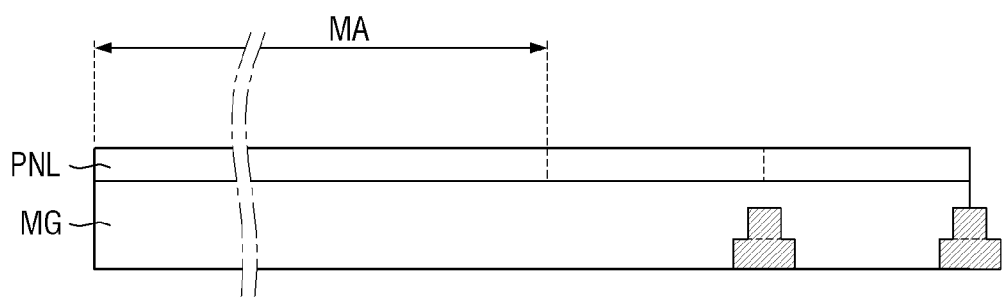
FIG. 19 is a cross-sectional view illustrating an embodiment of a plotting process of the display device of FIG. 18.
Figure 19:
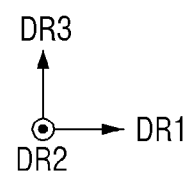
Figure 20:
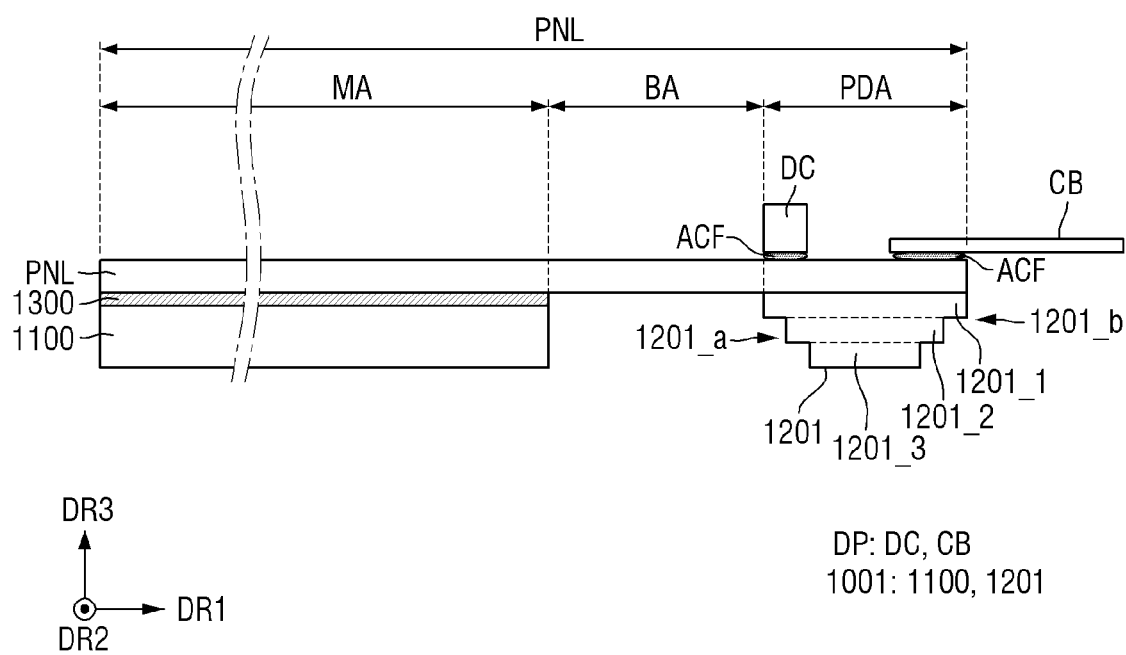
FIG. 20 is a cross-sectional view illustrating an embodiment of a process of providing a flexible support part attached in the display device of FIG. 18.
Figure 21:
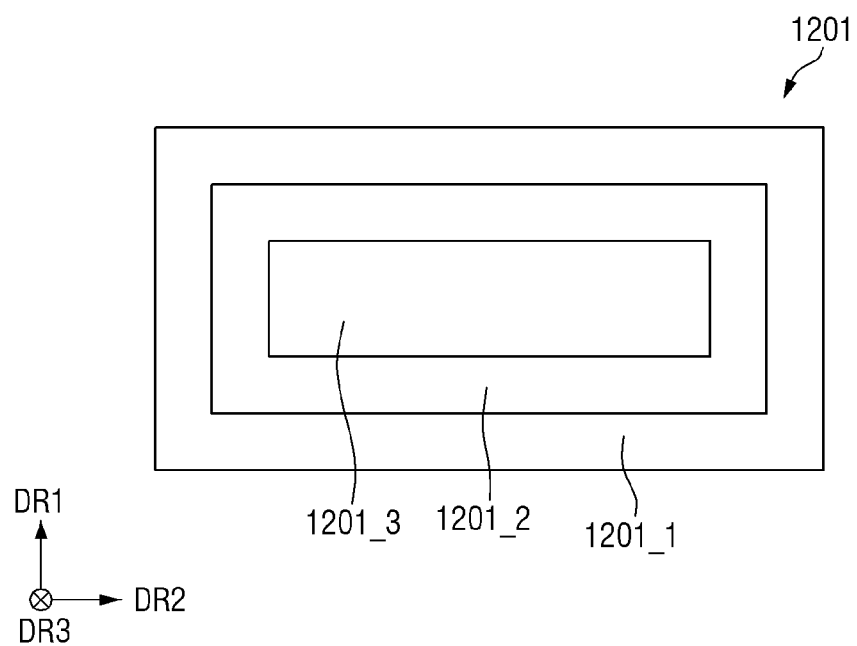
FIG. 21 is a plan view of an embodiment of a rigid support part of the display device of FIG. 18.

FIG. 18 is a cross-sectional view illustrating an embodiment of a display device 1_1 which is bent. FIG. 19 is a cross-sectional view illustrating an embodiment of a plotting process of the display device 1_1 of FIG. 18. FIG. 20 is a cross-sectional view illustrating an embodiment of a process of attaching a flexible support part 1100 of the display device 1_1 of FIG. 18. FIG. 21 is a plan view of an embodiment of a rigid support part 1201 on a lower surface of a pad area PDA of a display panel PNL of the display device 1_1 of FIG. 18 when viewed in a third direction DR3.

Referring to FIGS. 18 to 21, it is described by way of example that a rigid support part 1201 of a display device 1_1 may have a multi-stage configuration including a plurality of stage-layer parts 1201_1, 1201_2, and 1201_3 (e.g., plurality of thickness portions). The rigid support part 1201 may include a stepped structure defined by the stage-layer parts 1201_1, 1201_2, and 1201_3 having different widths. End surfaces of the stage-layer parts 1201_1, 1201_2, and 1201_3 at a same side of the rigid support part 1201 may together form the first side surface 1201_a and the second side surface 1201_b, respectively.

The rigid support part 1201 may include the plurality of stage-layer parts 1201_1, 1201_2, and 1201_3. A first stage-layer part 1201_1 (e.g., first thickness portion which is closest to the display panel PNL) of the plurality of stage-layer parts 1201_1, 1201_2, and 1201_3 serves to facilitate the process of peeling off a portion of the rigid mother substrate MG and the process of obtaining the cells C by scribing a mother substrate.

The rigid support part 1201 may have a stage shape (e.g., stepped-shape) in which a width thereof in a direction along the display panel PNL decreases in a direction toward the other side in the third direction DR3 (e.g., toward the display panel PNL), The stepped shape is defined at both a first side surface 1201_a and a second side surface 1201_b of the rigid support part 1201, when viewed in the second direction DR2 as illustrated in FIG. 20 for the bending area BA which is not bent, but is not limited thereto.

The rigid support part 1201 having the multi-stage configuration may include the first stage-layer part 1201_1, a second stage-layer part 1201_2, and a third stage-layer part 1201_3, in order in a direction away from the display panel PNL. The rigid support part 1201 may include three stage-layer parts as illustrated in FIGS. 18 and 20, but is not limited thereto. The first stage-layer part 1201_1, the second stage-layer part 1201_2, and the third stage-layer part 1201_3 may have the same thickness in the third direction DR3, but are not limited thereto.

The first stage-layer part 1201_1 may be in contact with the pad area PDA of the display panel PNL, have a shape substantially the same as a shape of the pad area PDA in a plan view, and may have a thickness in the third direction DR3. In the display device 1_1 which is not bent, one end (e.g., at the second side surface 1201_b) of the first stage-layer part 1201_1 of the rigid support part 1201 in the first direction DR1 may be aligned with one end of the pad area PDA of the display panel PNL in the first direction DR1 (e.g., coplanar).

The second stage-layer part 1201_2 has an area smaller than that of the first stage-layer part 1201_1. The first stage-layer part 1201_1 may be disposed to protrude further than both opposing ends of the second stage-layer part 1201_2 in the first direction DR1 and further than both opposing ends of the second stage-layer part 1201_2 in the second direction DR2, when viewed in the third direction DR3 as illustrated in FIG. 21 from a lower portion of the first stage-layer part 1201_1.

The third stage-layer part 1201_3 has an area smaller than that of the second stage-layer part 1201_2. The second stage-layer part 1201_2 may be disposed to protrude further than both opposing sides of the third stage-layer part 1201_3 in the first direction DR1 and further than both opposing sides of the third stage-layer part 1201_3 in the second direction DR2, when viewed in the third direction DR3 as illustrated in FIG. 21 from a lower portion of the second stage-layer part 1201_2.

The other surface of the rigid support part 1201, that is, the other surface of the third stage-layer part 1201_3 may be attached to the other surface of the flexible support part 1100, as illustrated in FIG. 18, in the display device 1_1 which is bent at the bending area BA. In this case, the area of the third stage-layer part 1201_3 is smaller than that of the first stage-layer part 1201_1, and thus, an amount of the adhesive member 1400 (see FIG. 5) used for attaching the flexible support part 1100 and the rigid support part 1201 of the lower support body 1001 to each other may decrease, which may be advantageous in terms of process.

Since the rigid support part 1201 has the smallest total thickness at a portion corresponding to where the first stage-layer part 1201_1 protrudes from the second stage-layer part 1201_2, when the peel-off process is performed at a first side surface 1201_a of the rigid support part 1201 which is closest to the removed portion of the rigid mother substrate MG, the peel-off of the rigid mother substrate MG may be more easily performed.

When the process of obtaining the cells C by cutting the resulting product of the mother unit processes along the scribing lines SL is performed, the first stage-layer part 1201_1 at the second side surface 1201_b of the rigid support part 1201 where the cutting is performed has a small thickness at a portion thereof protruding from the second stage-layer part 1201_2, such that the display panel PNL and the rigid support part 1201 may be simultaneously cut, and thus, process performance may be improved.

Hereinafter, an embodiment of a process of manufacturing the rigid support part 1201 will be described.

In a plotting process of the display device 1_1, as illustrated in FIG. 19, several scribing steps using a laser may be performed at both side surfaces, in the first direction DR1, and both side surfaces, in the second direction DR2, at a portion of the rigid mother substrate MG corresponding to the pad area PDA, to make a thickness multistage (e.g., stepped structure).

Specifically, the several scribing steps may be sequentially performed in an overlapping manner in areas where the previous scribing steps were performed by sharing virtual planes passing through the edge of the pad area PDA of the display panel PNL as axes, and dimensions of scribed areas may sequentially decrease in a direction toward the display panel PNL. In addition, in the respective scribing steps, the rigid mother substrate MG may be scribed at thicknesses in the third direction DR3. The sum of the thicknesses in the third direction DR3 by which the rigid mother substrate MG is scribed in the respective scribing steps may not exceed the total thickness of the rigid mother substrate MG in the third direction DR3.

Accordingly, as the scribing is performed, the rigid mother substrate MG on which the scribing is performed may be formed in a multi-stage structure having the stage shape in which the thickness thereof in the third direction DR3 decreases and the planar dimensions thereof converge to become smaller toward the other side in the third direction DR3. The multi-stage configurations of both of opposing side surfaces of the rigid mother substrate MG in the first direction DR1 and both of opposing side surfaces of the rigid mother substrate MG in the second direction DR2, may be simultaneously formed by the same plotting process.

Figure 22:
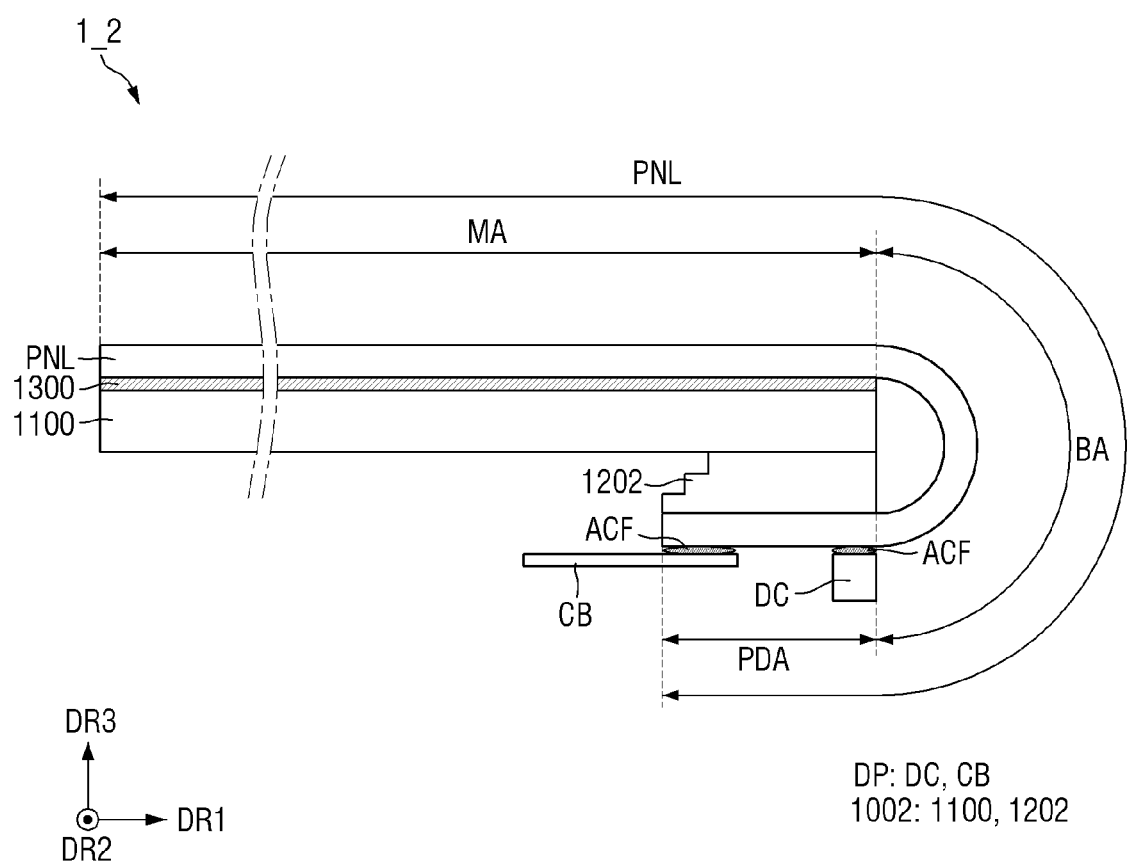
FIG. 22 is a cross-sectional view illustrating an embodiment of a display device which is bent.
Figure 23:
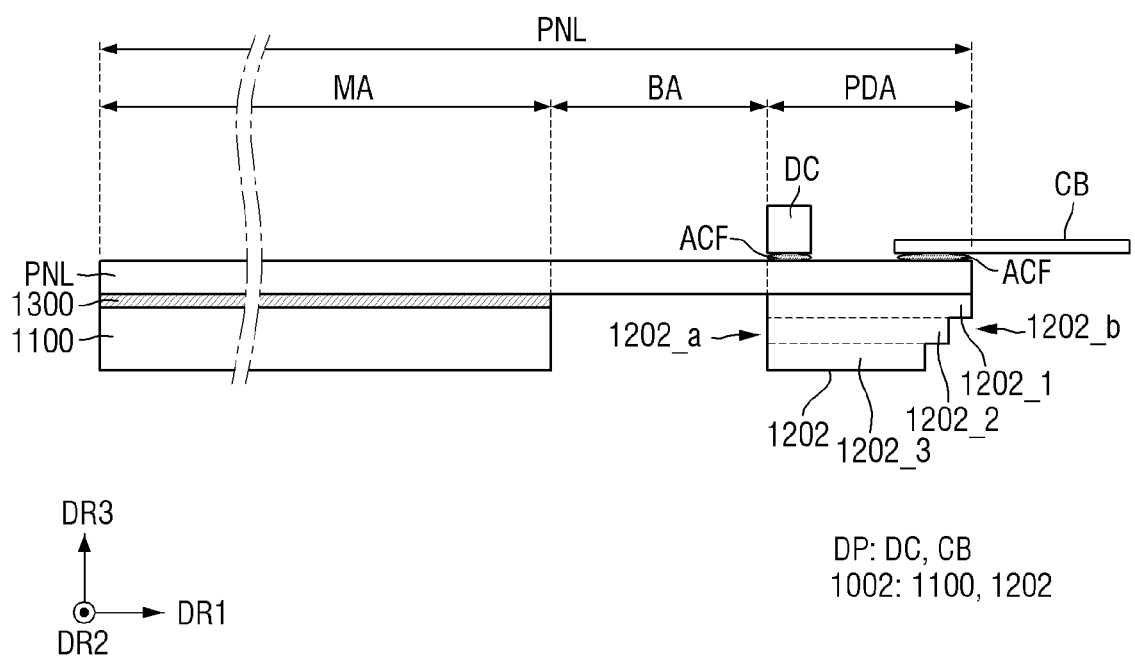
FIG. 23 is a cross-sectional view illustrating an embodiment of a process of providing a flexible support part attached in the display device of FIG. 22.

FIG. 22 is a cross-sectional view illustrating an embodiment of a display device 1_2 which is bent. FIG. 23 is a cross-sectional view illustrating an embodiment of a process of attaching a flexible support part 1100 of the display device 1_2 of FIG. 22. A lower support body 1002 may include the flexible support part 1100 and a rigid support part 1202. The rigid support part 1202 may include the first stage-layer part 1202_1, a second stage-layer part 1202_2, and a third stage-layer part 1202_3, in order in a direction away from the display panel PNL.

Referring to FIGS. 22 and 23, a display device 1_2 is different from the display device 1_1 of FIG. 18 in that a first side surface 1202_a of a rigid support part 1202 on the lower surface of the pad area PDA of the display panel PNL does not have a multi-stage configuration.

The rigid support part 1202 may have an end surface parallel to a plane passing through a boundary between the bending area BA and the pad area PDA at a first side surface 1202_a thereof. The rigid support part 1202 also may have a stage shape (e.g., stepped shape) in which a width thereof decreases in a direction toward the other side in the third direction DR3 at a second side surface 1202_b thereof, when viewed in the second direction DR2 as illustrated in FIG. 23 in the display device 1_2 which is not bent.

Figure 24:
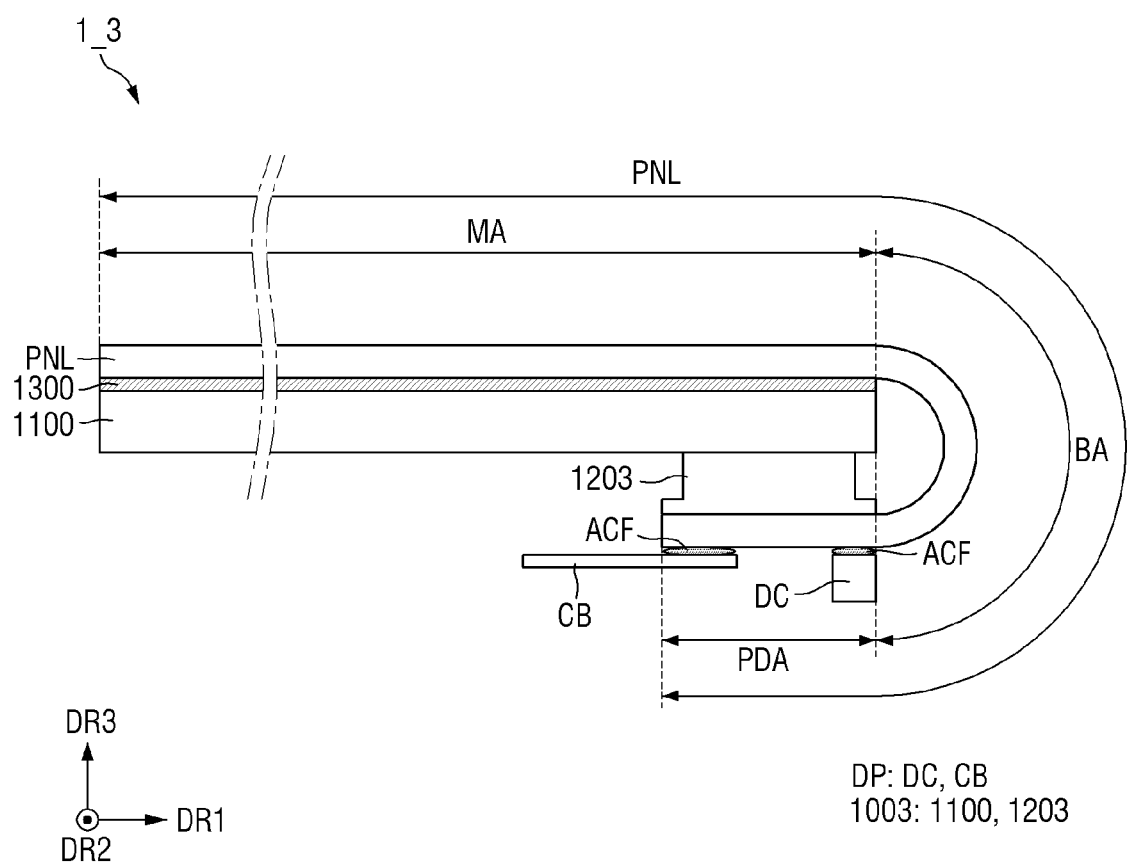
FIG. 24 is a cross-sectional view illustrating an embodiment of a display device which is bent.
Figure 25:
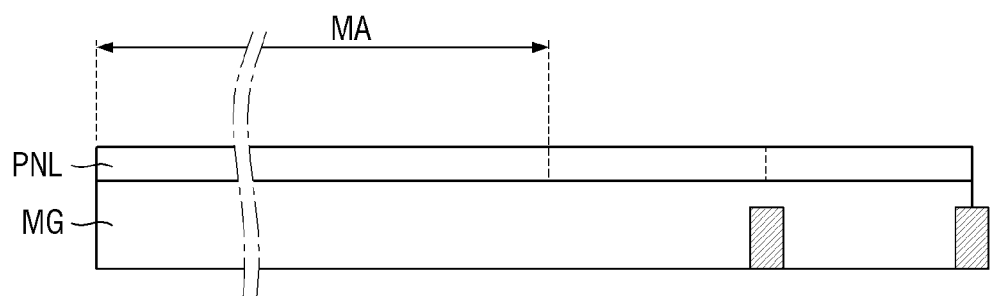
FIG. 25 is a cross-sectional view illustrating an embodiment of a plotting process of the display device of FIG. 24.
Figure 25:
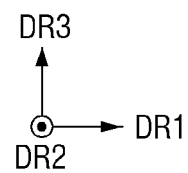
Figure 26:
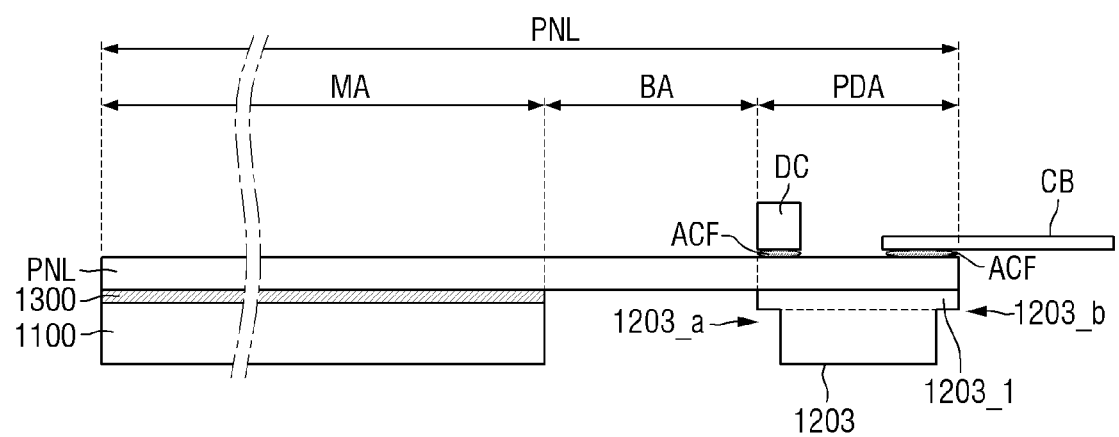
FIG. 26 is a cross-sectional view illustrating an embodiment of a process of providing a flexible support part attached in the display device of FIG. 24.
Figure 26:
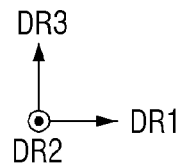

FIG. 24 is a cross-sectional view illustrating an embodiment of a display device 1_3 which is bent. FIG. 25 is a cross-sectional view illustrating an embodiment of a plotting process of the display device 1_3 of FIG. 24. FIG. 26 is a cross-sectional view illustrating an embodiment of a process of attaching a flexible support part 1100 of the display device 1_3 of FIG. 24. A lower support body 1003 may include the flexible support part 1100 and a rigid support part 1203.

Referring to FIGS. 24 to 26, it is described by way of example that a rigid support part 1203 of a display device 1_3 may be formed in a multi-stage structure having only one stage-layer part 1203_1.

The rigid support part 1203 may have a plane parallel to the third direction DR3 at a remaining thickness portion except for a thickness portion at the stage-layer part 1203_1 as illustrated in FIG. 26, in the display device 1_2 which is unbent at the bending area BA, but is not limited thereto.

When the rigid support part 1203 is viewed in the second direction DR2 as illustrated in FIG. 26, the stage-layer part 1203_1 may protrude further from a first side surface 1203_a of the remaining thickness portion and further from a second side surface 1203_b of the remaining thickness portion within the rigid support part 1203, at both sides in the first direction DR1. It has been illustrated in FIG. 26 that the stage-layer part 1203_1 has the same width in the first direction DR1 taken from the first side surface 1203_a of the remaining thickness portion and from the second side surface 1203_b of the remaining thickness portion, but the disclosure is not limited thereto. In an embodiment, for example, with respect to a side surface of the remaining thickness portion, a width of the stage-layer part 1203_1 in the first direction DR1 at the first side surface 1203_a of the rigid support part 1203 and a width of the stage-layer part 1203_1 in the first direction DR1 at the second side surface 1203_b of the rigid support part 1203 may also be different from each other.

In a plotting process of the display device 1_3, as illustrated in FIG. 25, one scribing step using a laser may be performed at both of opposing side surfaces, in the first direction DR1, and both of opposing side surfaces, in the second direction DR2, of a portion of the rigid mother substrate MG corresponding to the pad area PDA, to make a thickness of the rigid support part 1203 as multistage.

The multi-stage configurations at both of opposing side surfaces of the rigid mother substrate MG in the first direction DR1 and both of opposing side surfaces of the rigid mother substrate MG in the second direction DR2 may be simultaneously formed by the same plotting process.

Figure 27:
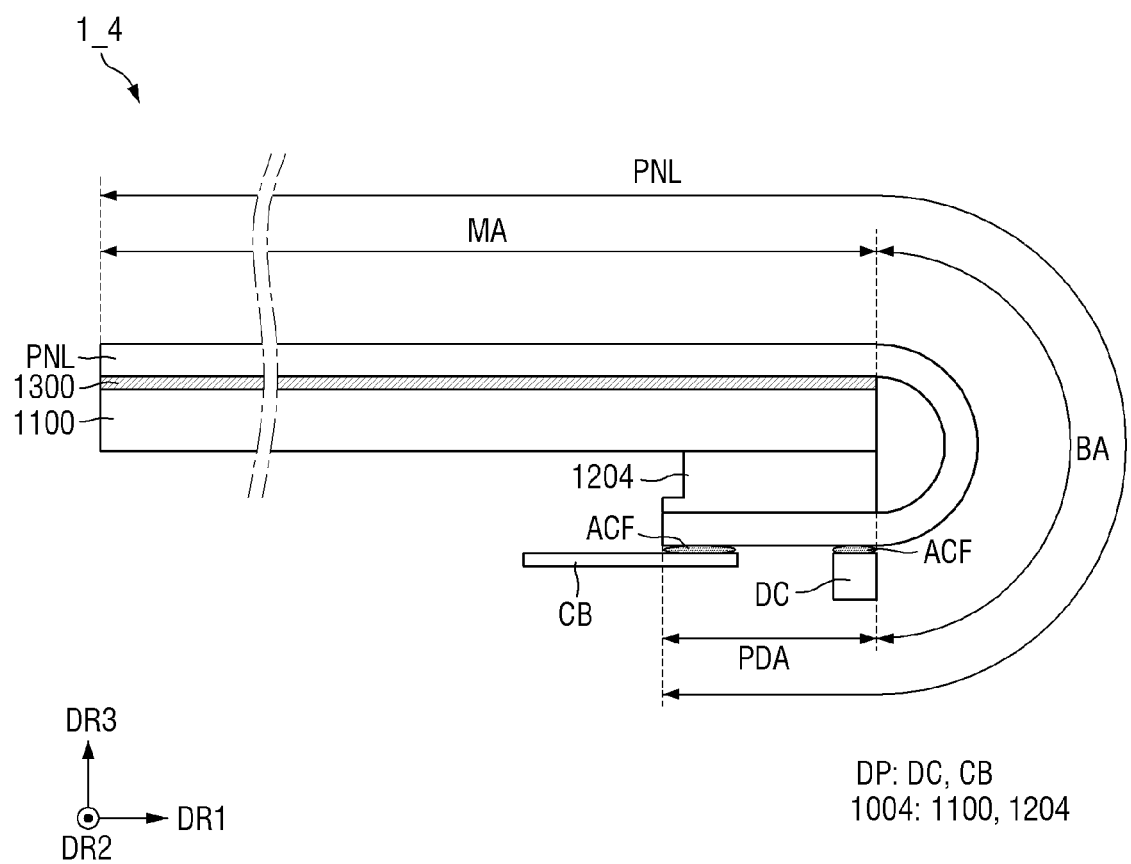
FIG. 27 is a cross-sectional view illustrating an embodiment of a display device which is bent.
Figure 28:
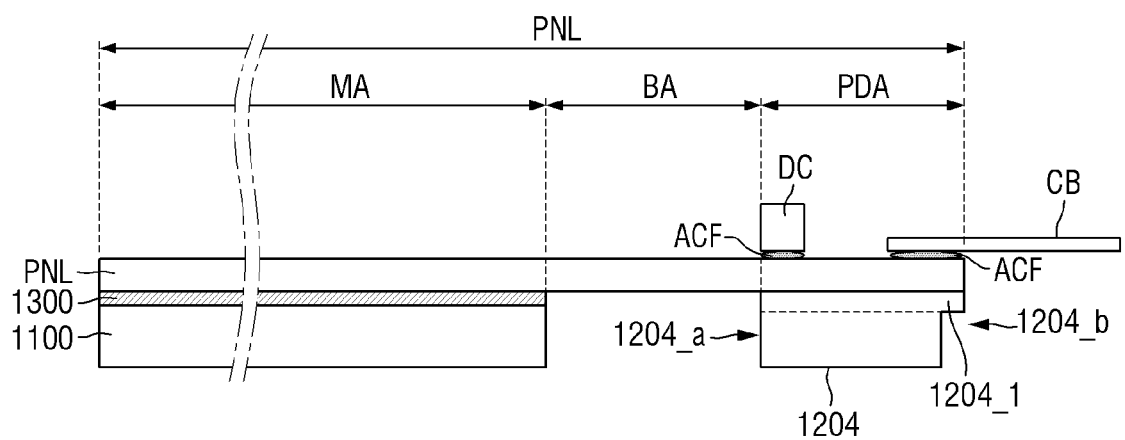
FIG. 28 is a cross-sectional view illustrating an embodiment of a process of providing a flexible support part attached in the display device of FIG. 27.

FIG. 27 is a cross-sectional view illustrating a display device 1_4 which is bent. FIG. 28 is a cross-sectional view illustrating an embodiment of a process of attaching a flexible support part 1100 of the display device 1_4 of FIG. 27. A lower support body 1004 may include the flexible support part 1100 and a rigid support part 1204.

Referring to FIGS. 27 and 28, a display device 1_4 is different from the display device 1_3 of FIG. 24 in that a first side surface 1204_a of a rigid support part 1204 on the lower surface of the pad area PDA of the display panel PNL does not have a multi-stage configuration and may be in one plane (e.g., planar or flat). A second side surface 1204_b which is opposite to the first side surface 1204_a has a stepped structure, defined by stage-layer part 1204_1 protruding from the second side surface 1204_b of the remaining thickness portion of the rigid support part 1204 which is furthest from the display panel PNL. That is, the rigid support part 1204 may have the largest planar area and a smallest thickness at a thickness portion closest to the display panel PNL.

Figure 29:
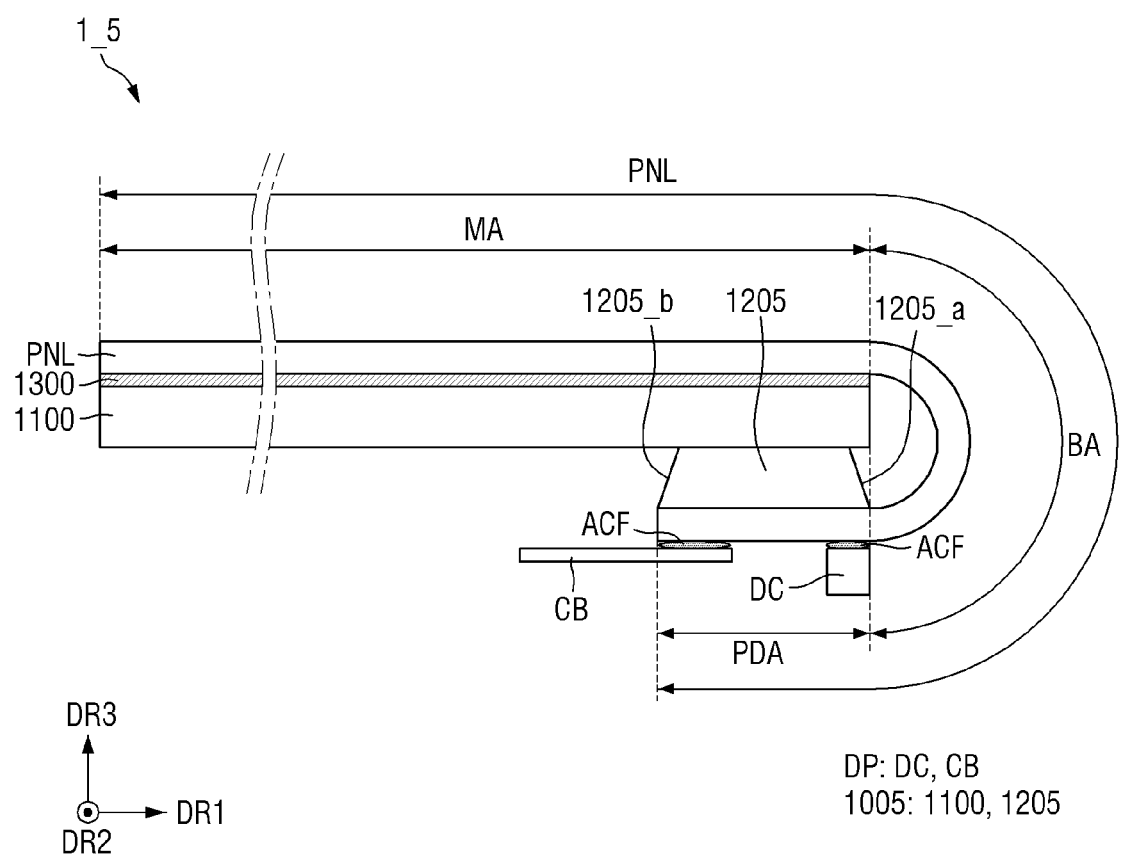
FIG. 29 is a cross-sectional view illustrating an embodiment of a display device which is bent.

FIG. 29 is a cross-sectional view illustrating an embodiment of a display device 1_5 which is bent. A lower support body 1005 may include the flexible support part 1100 and a rigid support part 1205.

Referring to FIG. 29, it is described by way of example that a rigid support part 1205 of a display device 1_5 may have a trapezoidal shape in which a width thereof becomes smaller toward the third direction DR3 (e.g., in a direction toward the display panel PNL, in the display device 1_5 which is bent at the bending area BA. It has been illustrated in FIG. 29 that a cross section of the rigid support part 1205 of a lower surface of a display panel PNL is an equilateral trapezoid of which both oblique sides have the same length, but the disclosure is not limited thereto.

The rigid support part 1205 may be formed to become gradually narrower along the third direction DR3 in the display device 1_5 which bent at the bending area BA, as illustrated in FIG. 29. In other words, a first side surface 1205_a which is closest to the flexible support part 1100 along the display panel PNL and a second side surface 1205_b which is furthest from the flexible support part 1100 along the display panel PNL are formed as oblique sides. As including the oblique sides, an area of one surface of the rigid support part 1205 may be greater than that of the other surface of the rigid support part 1205, and the rigid support part 1205 may have a continuous configuration without a stage-layer rather than the multi-stage configuration including several stage-layers defining a stepped structure. Accordingly, the rigid support part 1205 may support the pad area PDA at a thickness as small as possible at both ends of the pad area PDA.

Figure 30:
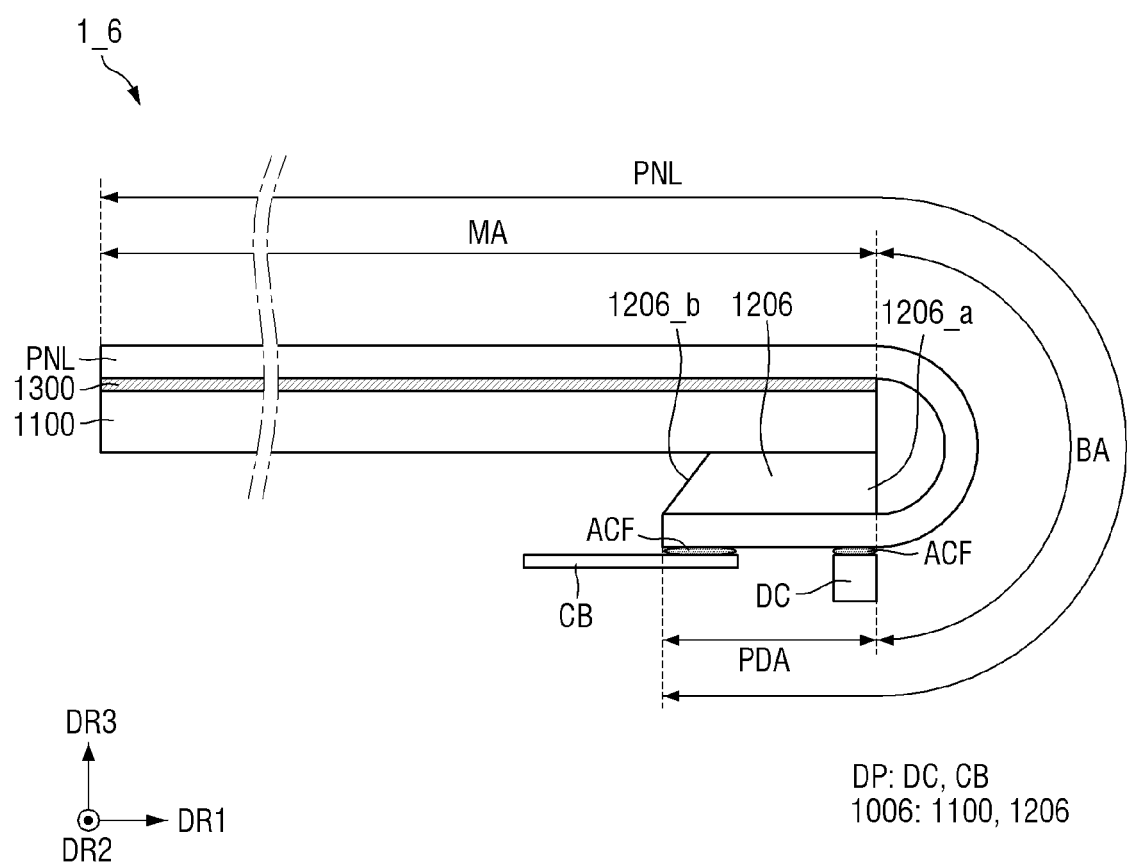
FIG. 30 is a cross-sectional view illustrating an embodiment of a display device which is bent.

FIG. 30 is a cross-sectional view illustrating an embodiment of a display device 1_6 which is bent. A lower support body 1006 may include the flexible support part 1100 and a rigid support part 1206.

Referring to FIG. 30, a display device 1_6 is different from the display device 1_5 of FIG. 29 in that a cross section of a rigid support part 1206 has a first side surface 1206_a which is flat (e.g., having a surface parallel to the third direction DR3) and a second side surface 1206_b being oblique or inclined with respect to the display panel PNL (e.g., having an oblique surface), that is, has a trapezoidal shape with one oblique side.

Figure 31:
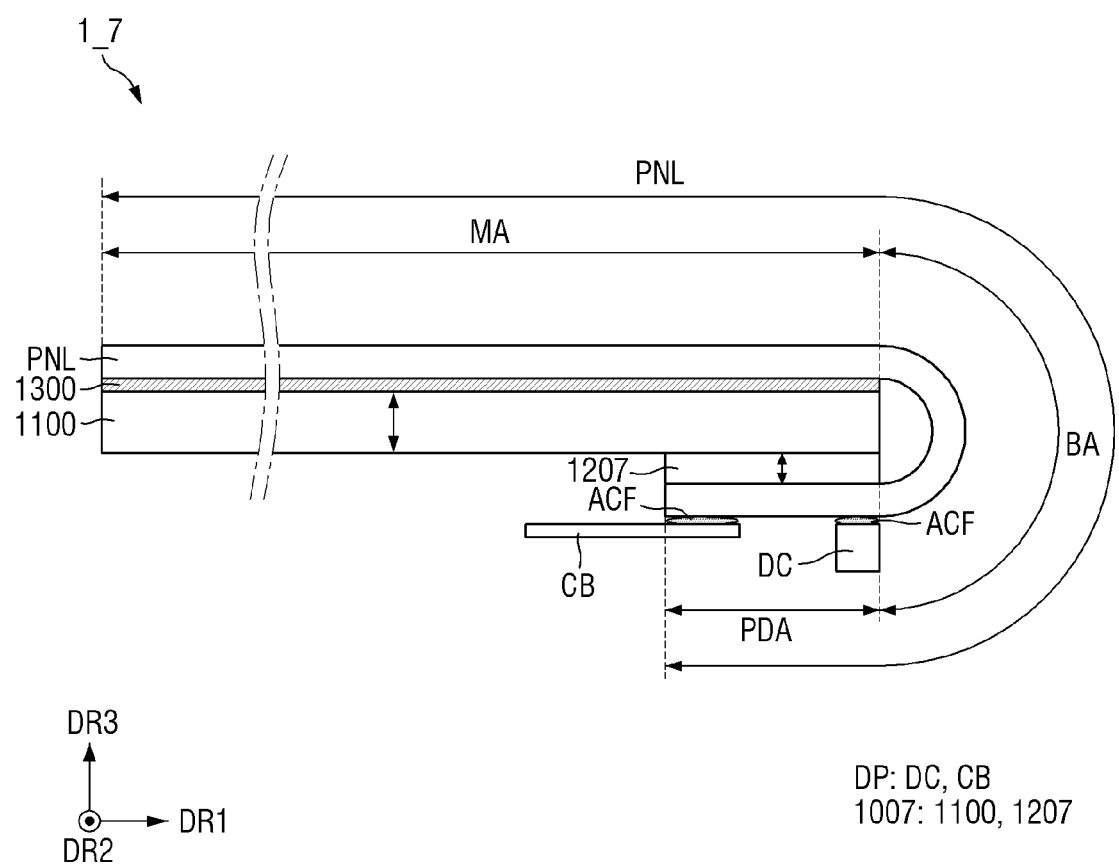
FIG. 31 is a cross-sectional view illustrating an embodiment of a display device which is bent.
Figure 32:
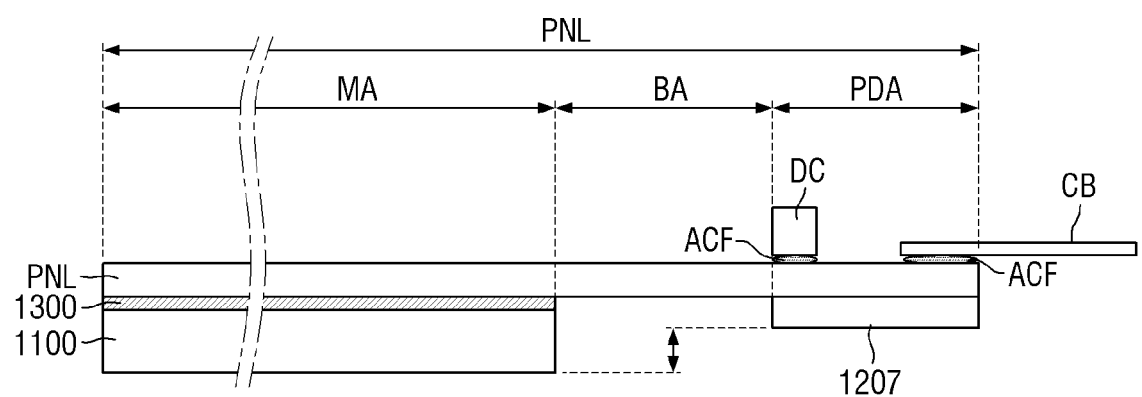
FIG. 32 is a cross-sectional view illustrating an embodiment of a process of cutting a mother substrate along a scribing line, absent a carrier film, in providing the display device of FIG. 31.
Figure 33:
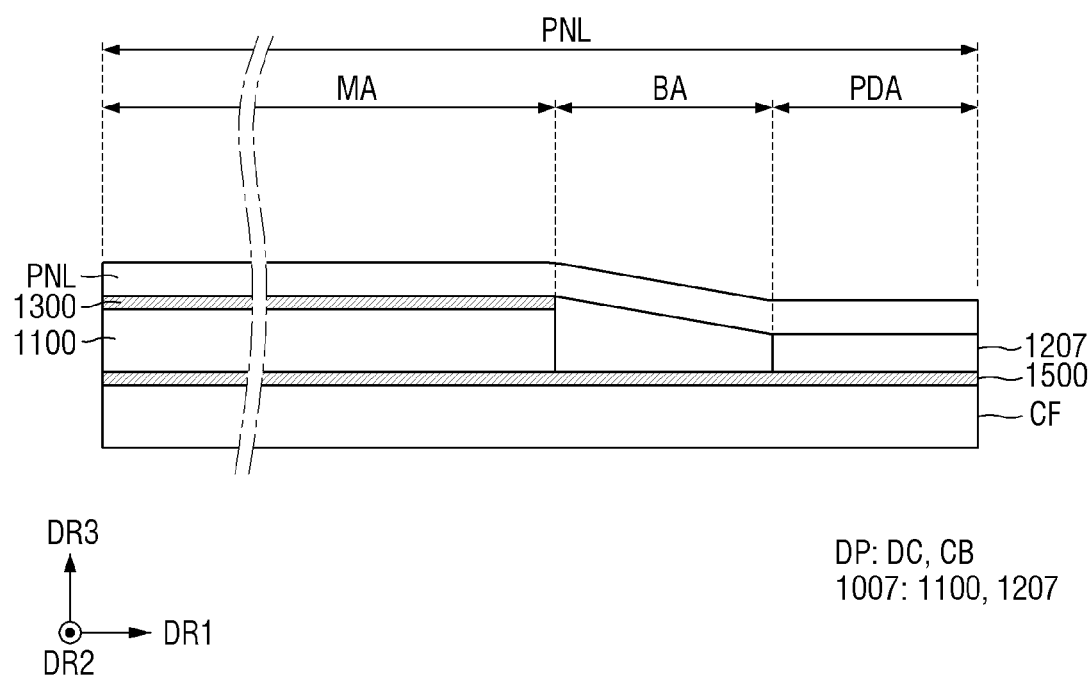
FIG. 33 is a cross-sectional view illustrating an embodiment of a process of providing a carrier film attached to the display device of FIG. 31.

FIG. 31 is a cross-sectional view illustrating an embodiment of a display device 1_7 which is bent. FIG. 32 is a cross-sectional view illustrating an embodiment of the display device 1_7 which is unbent. FIG. 33 is a cross-sectional view illustrating an embodiment of a process of attaching a carrier film CF to the cell C in still another embodiment of FIG. 31. A lower support body 1007 may include the flexible support part 1100 and a rigid support part 1207.

Referring to FIGS. 31 to 33, it is described by way of example that a total thickness of a rigid support part 1207 of a display device 1_7 may be smaller than that of the flexible support part 1100, and smaller than a sum of thicknesses of the flexible support part 1100 and the adhesive member 1300.

As illustrated in FIG. 31, when the rigid support part 1207 is attached to the other surface of the flexible support part 1100 by bending of the display device 1_7 at the bending area BA, a thickness of the rigid support part 1207 is relatively small, such that an entire thickness in the third direction DR3 of the display device 1_7 which is bent, may decrease.

As illustrated in FIG. 32, when the thickness of the rigid support part 1207 in the third direction DR3 is smaller than that of the flexible support part 1100 in the third direction DR3, as described above, the temperature for the head tool decreases, such that the temperature of the head tool may be stably maintained, and thus, stability of a process increases.

In order to perform the process of mounting the display driving circuit DC or the display circuit board CB on the pad area PDA of the display panel PNL, the carrier film CF may be attached to a lower support body 1007, that is, to the other surface of the flexible support part 1100 and the other surface of the rigid support part 1207, as described above. However, according to the present embodiment, the thickness of the rigid support part 1207 in the third direction DR3 is smaller than that of the flexible support part 1100 in the third direction DR3. Referring to FIG. 32, for example, in the in the display device 1_7 which is unbent, lower surfaces furthest from the display panel PNL of the flexible support part 1100 and the rigid support part 1207, may be spaced apart from each other along the third direction DR3 (e.g., double-headed arrow in FIG. 32). Thus, in the display device 1_7 which is unbent, the carrier film CF may be attached to the lower support body 1007 with the bending area BA of the display panel PNL slightly bent or inclined toward the other side in the third direction DR3, as illustrated in FIG. 33. That is, when the carrier film CF is attached to the lower support body 1007, the display panel PNL may have a step generated in the third direction DR3 at a boundary area between the main area MA and the pad area PDA.

Figure 34:
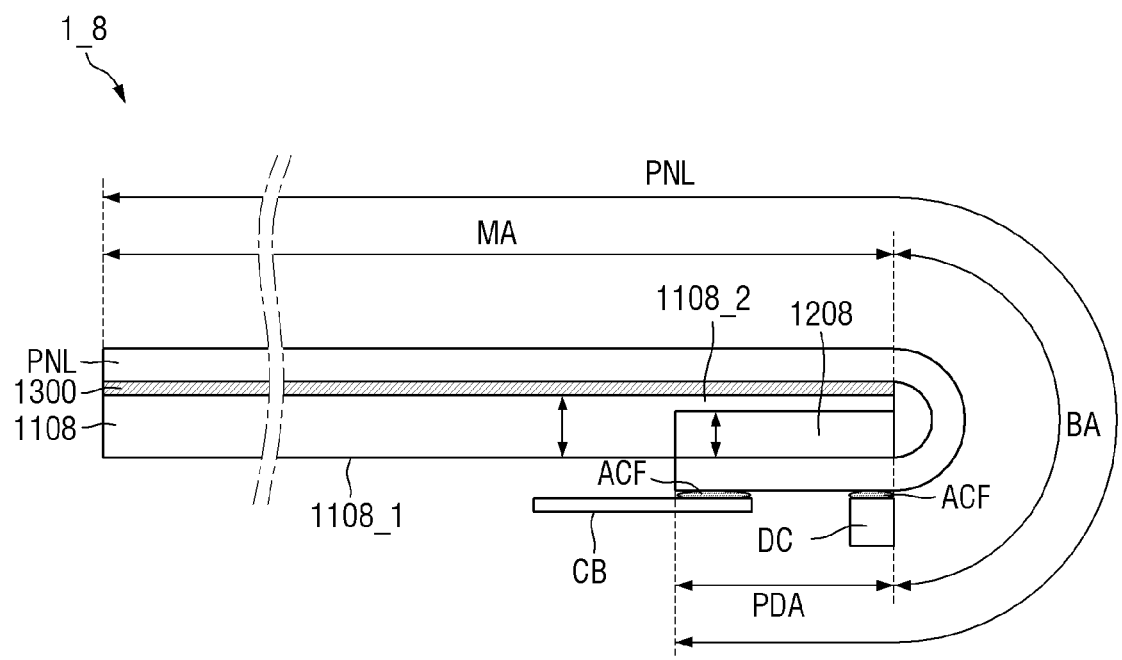
FIG. 34 is a cross-sectional view illustrating an embodiment of a display device which is bent.
Figure 35:
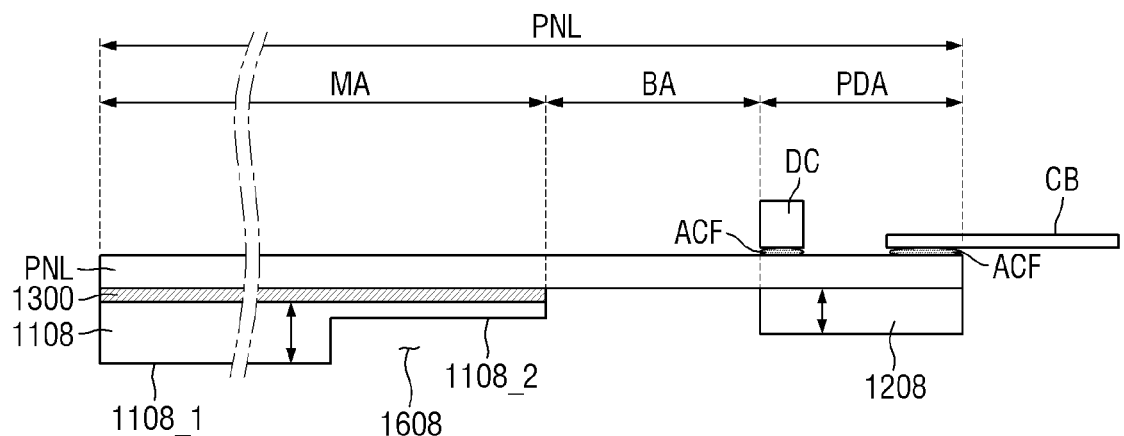
FIG. 35 is a cross-sectional view for describing embodiments of a flexible support part and a rigid support part in the display device of FIG. 34.
Figure 35:
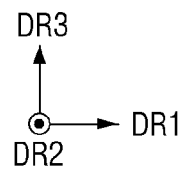
Figure 36:
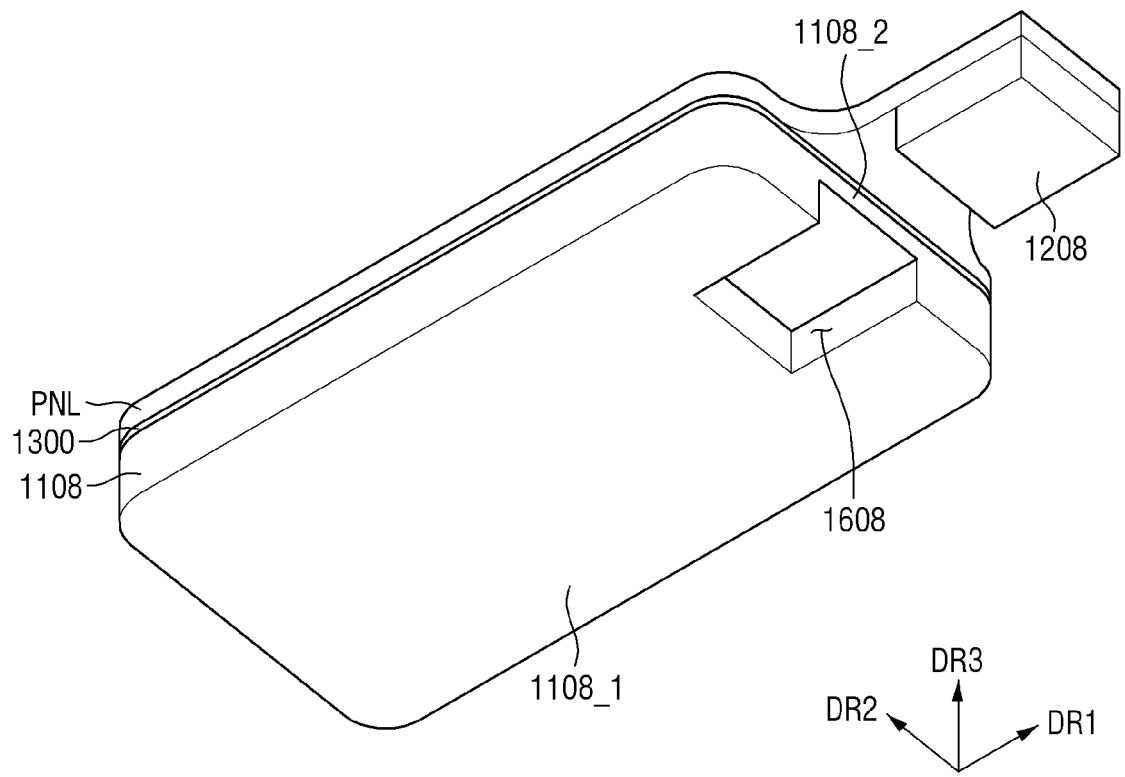
FIG. 36 is a perspective view of an embodiment of the display device of FIG. 34.

FIG. 34 is a cross-sectional view illustrating an embodiment of a display device 1_8 which is bent. FIG. 35 is a cross-sectional view illustrating an embodiment of a flexible support part 1108 and a rigid support part 1208 in the display device 1_8 of FIG. 34 which is unbent. FIG. 36 is a perspective view of the display device 1_8 of FIG. 34, which is unbent, when viewed in a third direction DR3. A lower support body 1008 may include the flexible support part 1108 and a rigid support part 1208.

Referring to FIGS. 34 to 36, it is described by way of example that in a display device 1_8, a rigid support part accommodating part 1608 (e.g., recess), which is a space in which a rigid support part 1208 may be accommodated, may be defined in or by a flexible support part 1108.

The flexible support part 1108 may include a flat part 1108_1 and a recessed part 1108_2. A thickness of the flexible support part 1108 may have a maximum value at the flat part 1108_1 and have a minimum value at the recessed part 1108_2.

The flat part 1108_1 may be a flat region of the flexible support part 1108. The flat part 1108_1 may be attached to the main area MA of the display panel PNL by an adhesive member 1300 interposed on one surface thereof, and the other surface of the flat part 1108_1 may be a surface facing the other side in the third direction DR3.

The recessed part 1108_2 is a region recessed toward one side of the third direction DR3 in the flexible support part 1108, and may be a region of the flexible support part 1108 except for the flat part 1108_1. The recessed part 1108_2 may be disposed at one end of the flexible support part 1108 in the first direction DR1 and at the center of the flexible support part 1108 in the second direction DR2, but is not limited thereto. The recessed part 1108_2 may be open in a direction away from the display panel PNL and in a direction facing the rigid support part 1208.

The recessed part 1108_2 may be attached to the main area MA of the display panel PNL by an adhesive member 1300 interposed on one surface thereof, and the other surface of the recessed part 1108_2 may be a surface facing the other side in the third direction DR3. The recessed part 1108_2 may be attached to the other surface of the rigid support part 1208 accommodated in a rigid support part accommodating part 1608 to be described later by a separate adhesive member interposed on the other surface thereof. The separate adhesive member may be a pressure sensitive adhesive, but is not limited thereto.

The rigid support part accommodating part 1608 may serve to accommodate the rigid support part 1208 to prevent the rigid support part 1208 from protruding at the other surface of the flexible support part 1108, when the other surface of the rigid support part 1208 is attached to the other surface of the flexible support part 1108 by bending of the display device 1_8 at the bending area BA.

The rigid support part accommodating part 1608 may be disposed in the flexible support part 1108 as a space surrounded by the flat part 1108_1 and the recessed part 1108_2 of the flexible support part 1108. The rigid support part accommodating part 1608 may be disposed at the center of the flexible support part 1108 in the second direction DR2 at one end of the flexible support part 1108 in the first direction DR1 which is closest to the rigid support part 1208, but is not limited thereto. When the rigid support part accommodating part 1608 is disposed at the center of the flexible support part 1108 in the second direction DR2 at the other end of the flexible support part 1108 in the first direction DR1 which is furthest from the rigid support part 1208, the recessed part 1108_2 may be disposed on one side of the rigid support part accommodating part 1608 in the third direction DR3, and the flat part 1108_1 may be disposed on the other side of the rigid support part accommodating part 1608 in the first direction DR1 and on both sides of the rigid support part accommodating part 1608 in the second direction DR2.

The rigid support part accommodating part 1608 may be an empty space having a shape corresponding to that of the rigid support part 1208, as illustrated in FIGS. 35 and 36. The rigid support part 1208 and the rigid support part accommodating part 1608 may have a rectangular parallelepiped shape as illustrated in FIGS. 34 to 36, but are not limited thereto. In an embodiment, for example, the rigid support part 1208 according to the present embodiment may have the shapes of the rigid support parts according to the embodiments of FIGS. 18 to 29 described above, and accordingly, the rigid support part accommodating part 1608 may have shapes corresponding to the shapes of the rigid support part 1208.

A thickness of the rigid support part accommodating part in the third direction DR3 may be defined as a value obtained by subtracting a thickness of the recessed part 1108_2 of the flexible support part 1108 from a thickness of the flat part 1108_1 of the flexible support part 1108. That is, when the thickness of the rigid support part accommodating part 1608 is smaller than the thickness of the flat part 1108_1, the recessed part 1108_2 may be defined. Consequently, when the recessed part 1108_2 is defined, the display panel PNL on the recessed part 1108_2 is not directly exposed to the outside the flexible support part 1108, and mechanical strength of the display panel PNL is thus reinforced, such that occurrence of line cracks may be prevented. Dimensions (e.g., widths) of the rigid support part accommodating part 1608 in the first direction DR1 and the second direction DR2 may be the same as widths of the recessed part 1108_2 in the first direction DR1 and the second direction DR2, respectively.

A depth of the rigid support part accommodating part 1608 along the third direction DR3 may be the same as a thickness of the rigid support part 1208, the width of the rigid support part accommodating part 1608 in the second direction DR2 may be the same as a width of the rigid support part 1208 in the second direction DR2, and the width of the rigid support part accommodating part 1608 in the first direction DR1 may be the same as a width of the rigid support part 1208 in the first direction DR1, but the disclosure is not limited thereto.

The thickness of the rigid support part 1208 accommodated in the rigid support part accommodating part 1608 may be smaller than the thickness of the flexible support part 1108, the width of the rigid support part 1208 in the second direction DR2 may be smaller than a width of the flexible support part 1108 in the second direction DR2, and the width of the rigid support part 1208 in the first direction DR1 may be smaller than a width of the flexible support part 1108 in the first direction DR1. Accordingly, when the bending area BA is bent, the rigid support part 1208 may be completely accommodated in the rigid support part accommodating part 1608, such that the rigid support part 1208 may not protrude further than the other surface (e.g., lower surface) of the flexible support part 1108.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:
1. A display device comprising:
a display panel including:

a main area including a plurality of pixels, a bending area at which the display panel is bendable, and a pad area, in order, and each of the main area, the bending area and the pad area including an upper surface, and a lower surface which is opposite to the upper surface;

a driving part on the upper surface of the pad area of the display panel;

a first adhesive member on the lower surface of the main area; and a lower support body on the lower surface of the display panel, the lower support body including:
- a flexible support part facing the lower surface of the main area with the first adhesive member therebetween, and
- a rigid support part which is directly on the lower surface of the pad area and is less flexible than the flexible support part.

2. The display device of claim 1, wherein within the lower support body:

the flexible support part includes a polymer film, and
the rigid support part includes glass.

3. The display device of claim 2, wherein the first adhesive member attaches the flexible support part to the display panel, at the main area.

4. The display device of claim 3, wherein at the pad area of the display panel, the rigid support part forms an interface with the lower surface of the display panel.

5. The display device of claim 1, wherein the rigid support part of the lower support body is disconnected from the flexible support part of the lower support body, at the bending area of the display panel.

6. The display device of claim 1, wherein
each of the first adhesive member, the rigid support part and the flexible support part has a thickness, and
the thickness of the rigid support part is equal to or smaller than a sum of the thickness of the flexible support part and the thickness of the first adhesive member.

7. The display device of claim 6, wherein the thickness of the rigid support part is about 200 micrometers or less.

8. The display device of claim 1, wherein the rigid support part includes:
a width defined in a direction along the display panel, and
a plurality of thickness portions arranged in a direction away from the display panel.

9. The display device of claim 8, wherein the width of the rigid support part decreases in the direction away from the display panel.

10. The display device of claim 9, wherein the rigid support part further includes:
a stepped structure defined by the plurality of thickness portions respectively having different widths, and
within the stepped structure:
the plurality of thickness portions includes a first thickness portion which is directly on the lower surface of the pad area, and
the rigid support part has the smallest thickness at the first thickness portion.

11. The display device of claim 1, wherein
the rigid support part includes a side surface which is closest to the flexible support part and a lower surface which is furthest from the display panel,
each of the side surface and the lower surface of the rigid support part has a surface roughness, and
the surface roughness of the side surface of the rigid support part and the surface roughness of the lower surface of the rigid support part are different from each other.

12. The display device of claim 11, wherein the surface roughness of the lower surface of the rigid support part is smaller than the surface roughness of the side surface of the rigid support part.

13. The display device of claim 1, wherein
the rigid support part includes a side surface which is furthest from the flexible support part,
the pad area of the display panel defines a side surface of the display panel which is furthest from the flexible support part, and
the side surface of the rigid support part is aligned with the side surface of the display panel.

14. A display device comprising:
a display panel including:
a main area including a plurality of pixels, a bending area at which the display panel is bendable, and a pad area, in order, and
each of the main area, the bending area and the pad area including an upper surface, and a lower surface which is opposite to the upper surface;
a driving part on the upper surface of the pad area of the display panel;
a first adhesive member and a second adhesive member on the lower surface of the main area; and
a lower support body on the lower surface of the display panel, the lower support body including:
a support film which is flexible and attached to the lower surface of the main area through the first adhesive member, and
a support glass which is directly on the lower surface of the pad area and is less flexible than the support film,
wherein the display panel which is bent at the bending area disposes the support film and the support glass facing each other and attached to each other through the second adhesive member.

15. The display device of claim 14, wherein
each of the support glass and the support film has a thickness, and
the thickness of the support glass is equal to or smaller than the thickness of the support film.

16. The display device of claim 14, wherein the support glass has a width which decreases in a direction away from the display panel.

17. A method of providing a display device, comprising:
providing a display panel including an upper surface, a lower surface which is opposite to the upper surface, a first area including a plurality of pixels, and a second area adjacent to the first area;
providing a glass substrate directly on the lower surface of the display panel, in both the first area and in the second area of the display panel;
removing a portion of the glass substrate corresponding to the first area of the display panel, from the display panel, to both:
provide the lower surface of the display panel which is exposed to outside the glass substrate at the first area of the display panel and defines an exposed lower surface of the display panel at the first area, and
provide a remaining portion of the glass substrate which corresponds to the second area of the display panel and defines a support glass directly on the lower surface of the display panel at the second area; and providing a flexible support film of the display panel attached to the exposed lower surface at the first area of the display panel, wherein the flexible support film at the first area has more flexibility than the support glass at the second area.

18. The method of claim 17, further comprising providing a driving part on the upper surface of the display panel, at the second area of the display panel which includes the support glass.

19. The method of claim 18, further comprising providing the display panel including the second area having each of the driving part and the support glass, bent at the second area, to dispose:

the first area and the second area facing each other, and
the flexible support film bonded to the support glass.

20. The method of claim 17, wherein each of the glass substrate and the flexible support film has a thickness, further comprising before the removing of the portion of the glass substrate, reducing the thickness the glass substrate to be equal to or smaller than the thickness of the flexible support film.

* * * * *